(12) United States Patent
Kobayashi et al.

(10) Patent No.: US 10,480,200 B2
(45) Date of Patent: Nov. 19, 2019

(54) DOUBLE FLOOR MEMBER

(71) Applicant: HITACHI METALS TECHNO, LTD., Koto-ku, Tokyo (JP)

(72) Inventors: Atsuhiko Kobayashi, Tokyo (JP); Susumu Soga, Saitama (JP)

(73) Assignee: SENQCIA CORPORATION, Tokyo (JP)

( * ) Notice: Subject to any disclaimer, the term of this patent is extended or adjusted under 35 U.S.C. 154(b) by 26 days.

(21) Appl. No.: 15/750,678

(22) PCT Filed: Aug. 6, 2015

(86) PCT No.: PCT/JP2015/072434
§ 371 (c)(1),
(2) Date: Feb. 6, 2018

(87) PCT Pub. No.: WO2017/022137
PCT Pub. Date: Feb. 9, 2017

(65) Prior Publication Data
US 2018/0223541 A1    Aug. 9, 2018

(51) Int. Cl.
*E04F 15/024* (2006.01)
*E04F 15/06* (2006.01)
*H05K 7/14* (2006.01)

(52) U.S. Cl.
CPC ........ *E04F 15/02417* (2013.01); *E04F 15/06* (2013.01); *E04F 2290/00* (2013.01); *H05K 7/1488* (2013.01)

(58) Field of Classification Search
CPC . E04F 15/02417; E04F 15/06; E04F 2290/02; E04F 2290/00; F16M 7/00; G06F 1/16; H05K 7/1497; H05K 7/1488
See application file for complete search history.

(56) References Cited

U.S. PATENT DOCUMENTS

| | | | | |
|---|---|---|---|---|
| 4,947,595 A | * | 8/1990 | Douds | B62D 33/044 |
| | | | | 52/177 |
| 8,434,275 B2 | * | 5/2013 | Hashimoto | E04F 15/02452 |
| | | | | 52/126.6 |
| 10,219,404 B2 | * | 2/2019 | Kobayashi | E04F 15/02405 |

FOREIGN PATENT DOCUMENTS

| | | | | | |
|---|---|---|---|---|---|
| JP | 08109733 | A | * | 4/1996 | ........ E04F 15/02417 |
| JP | 2003221924 | A | | 8/2003 | |
| JP | 2010255368 | A | * | 11/2010 | |
| JP | 2010261176 | A | | 11/2010 | |
| JP | 2016261176 | A | | 11/2010 | |
| JP | 2011058255 | A | * | 3/2011 | |
| JP | 2011069542 | A | | 4/2011 | |
| JP | 2012147523 | A | | 8/2012 | |
| JP | 2017089353 | A | * | 5/2017 | |

* cited by examiner

*Primary Examiner* — Hanh V Tran
(74) *Attorney, Agent, or Firm* — Bacon & Thomas, PLLC

(57) ABSTRACT

A double floor member is provided with: a guide rail 24 affixed to the upper face side; a first connection member 27 movable in the longitudinal direction of the guide rail 24 and engaged with the guide rail 24 so as not to be dislodged upward from the guide rail 24; and a second connection member 34 connected to the first connection member 27 so as not to lift upward from the first connection member 27. The second connection member 34 can be moved in a direction different from the longitudinal direction of the guide rail 24 by horizontally moving the position where the second connection member 34 is connected to the first connection member 27.

19 Claims, 45 Drawing Sheets

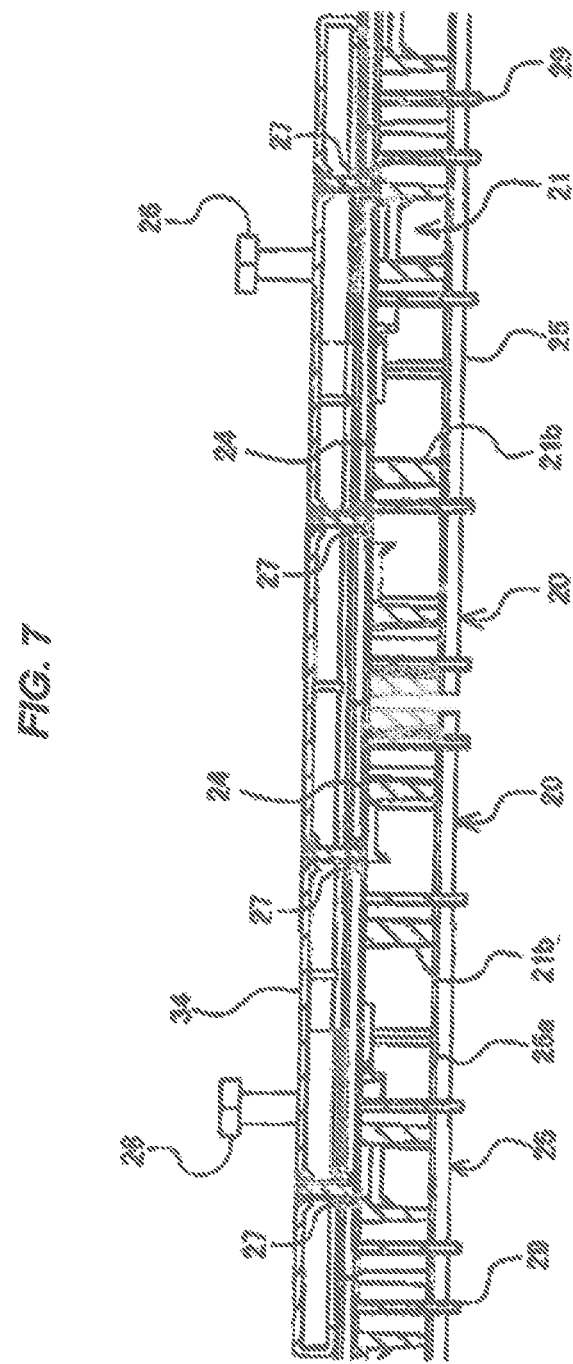

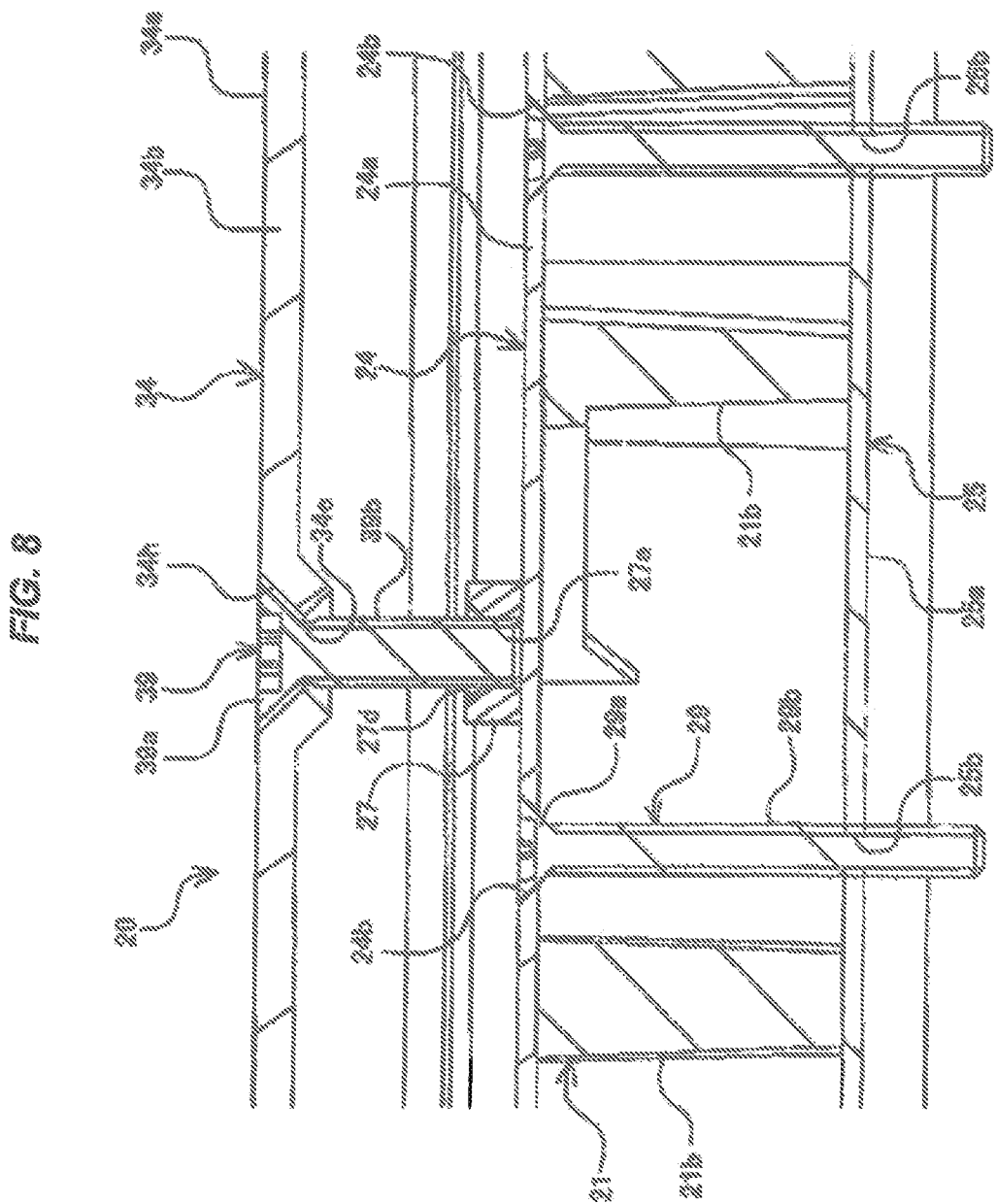

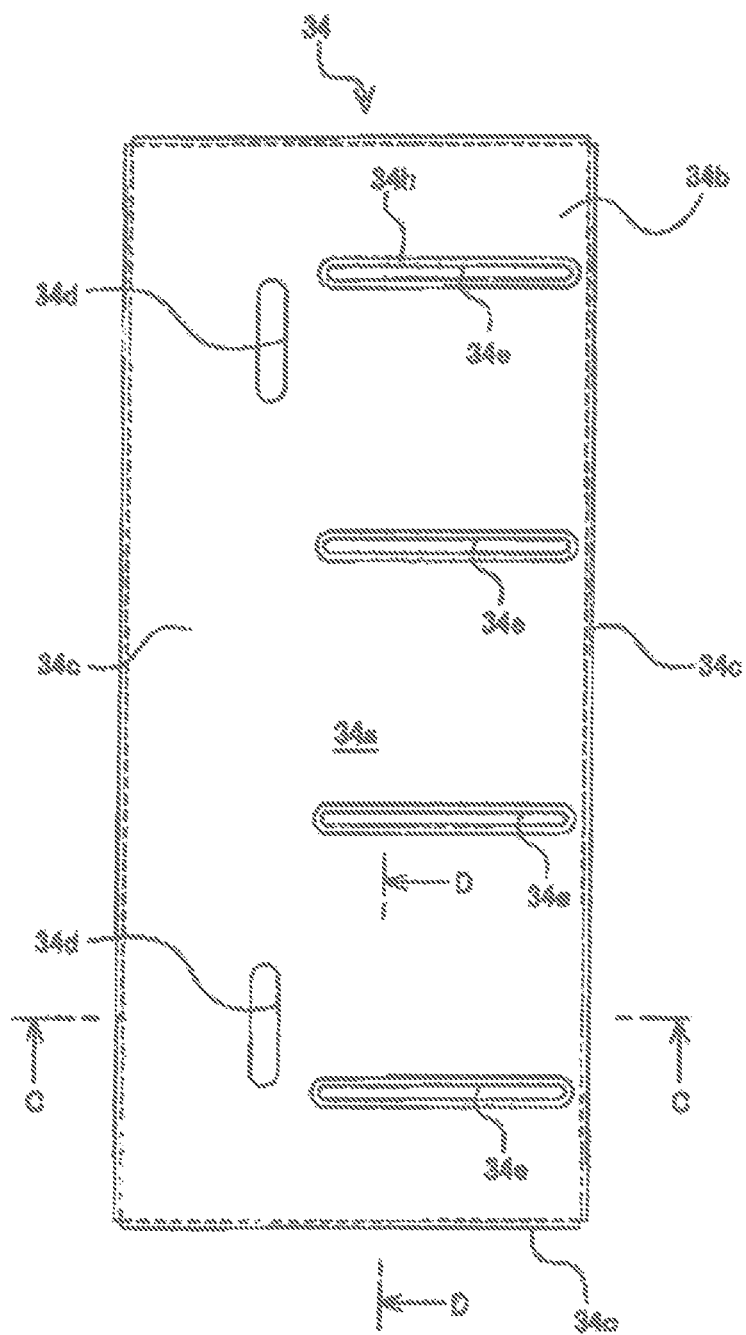

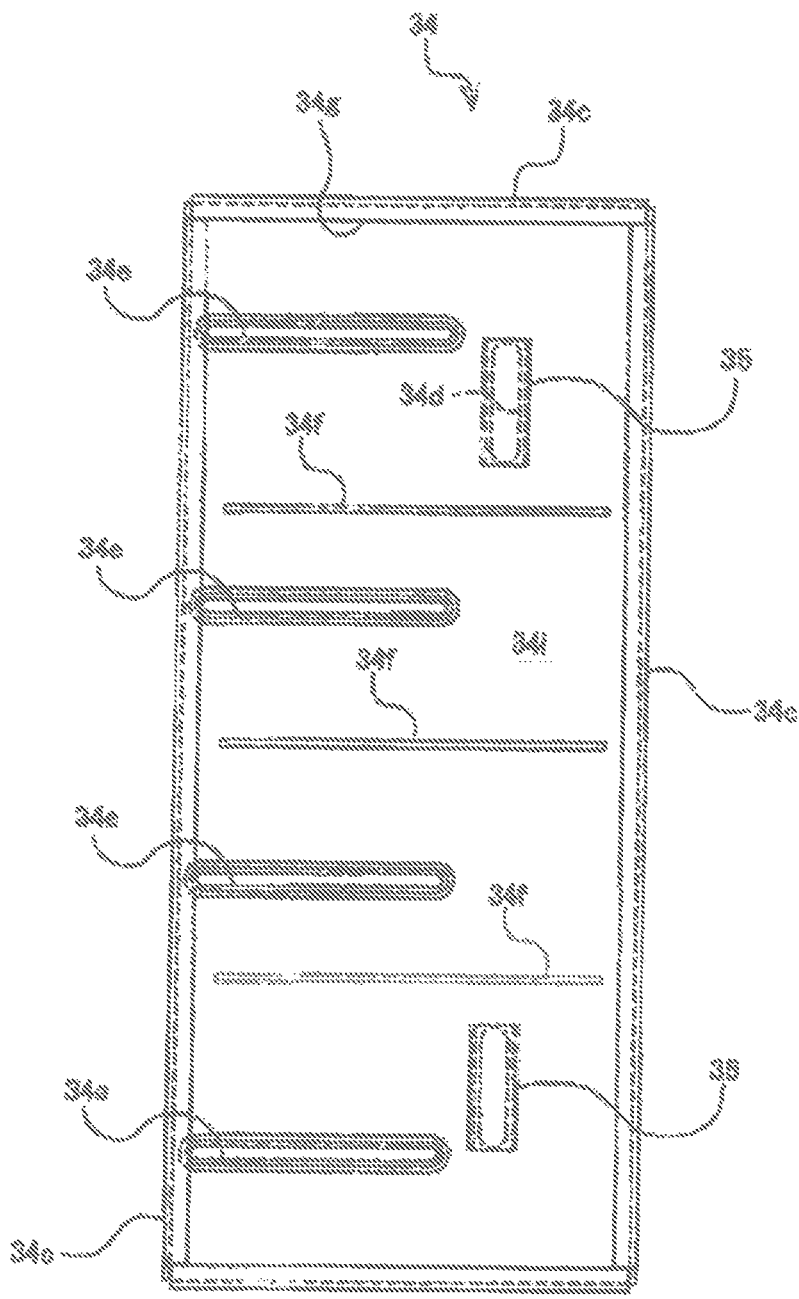

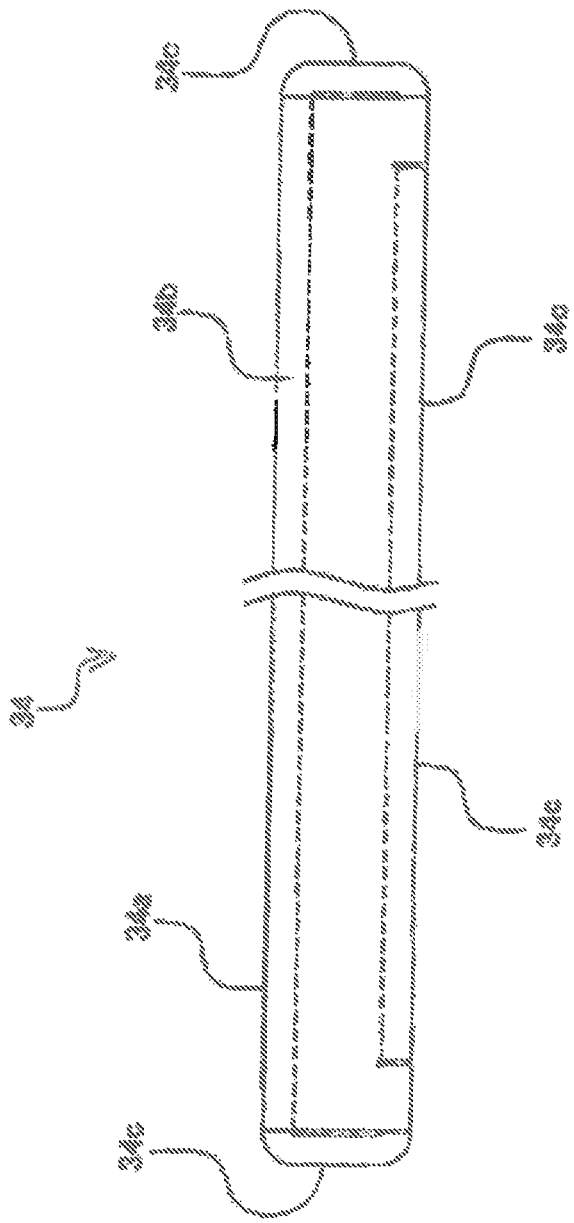

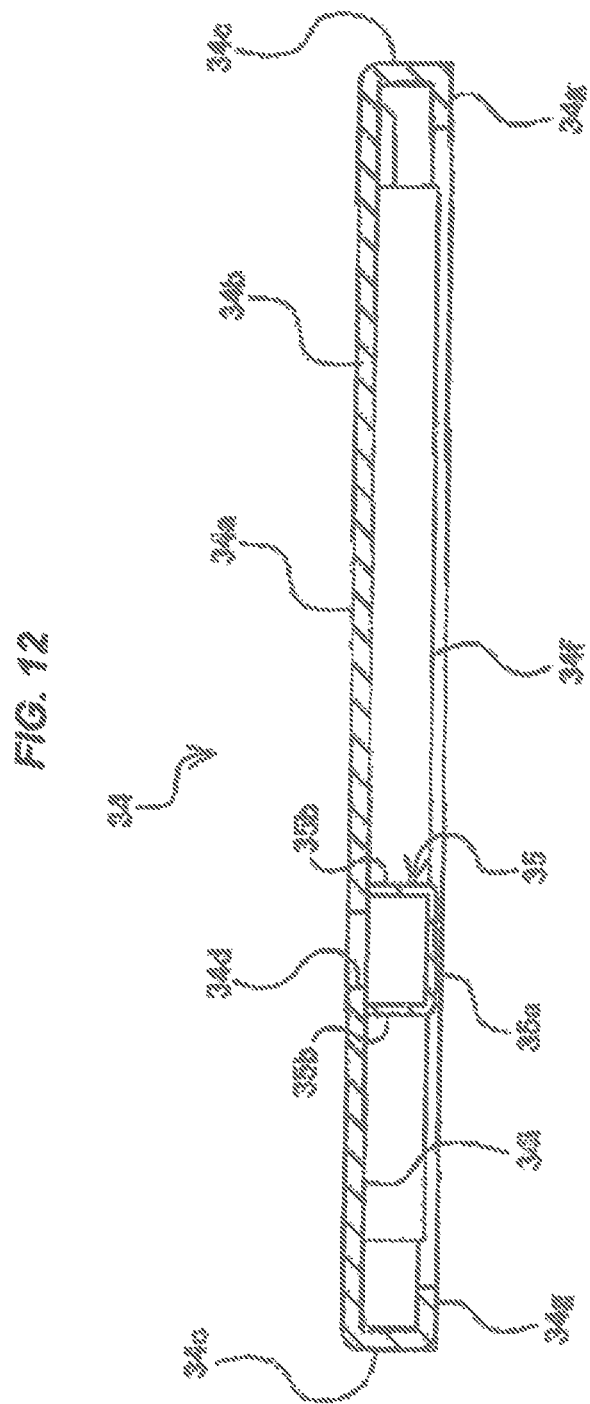

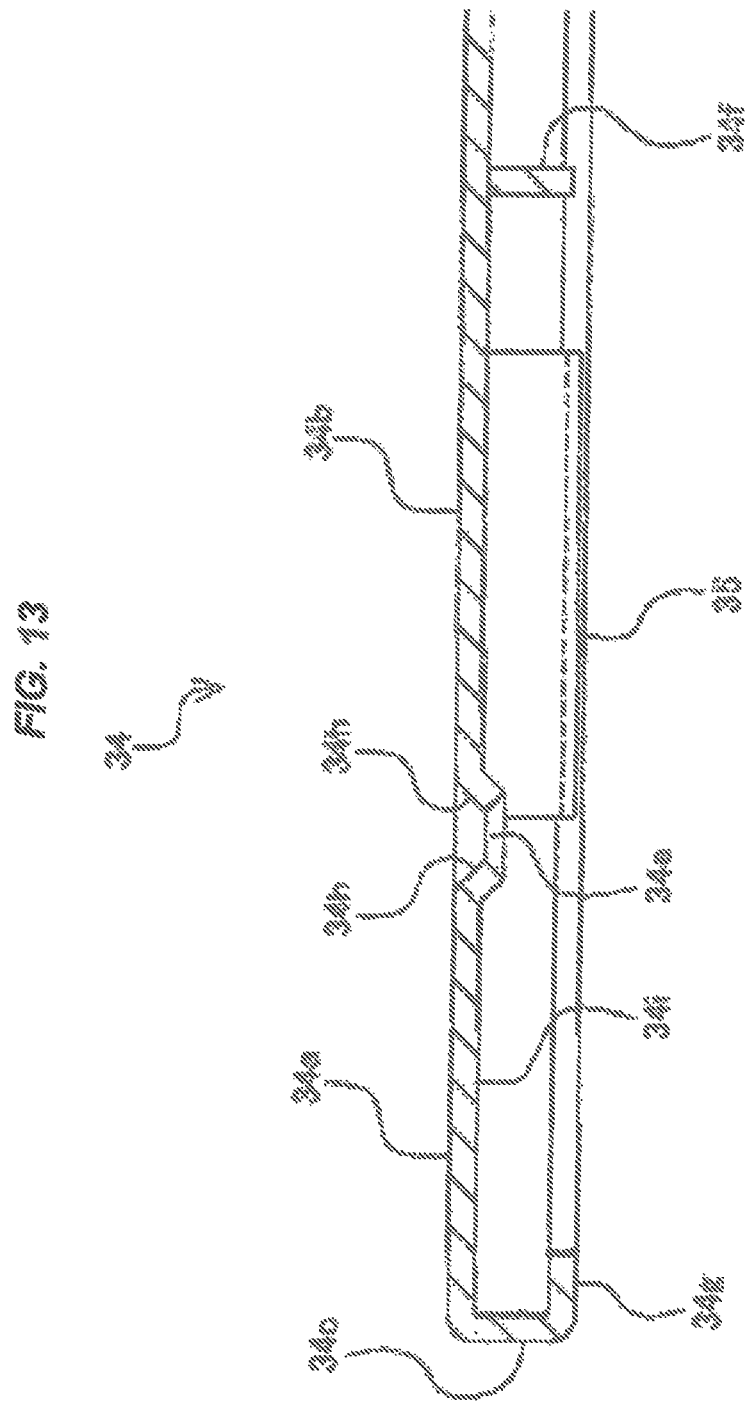

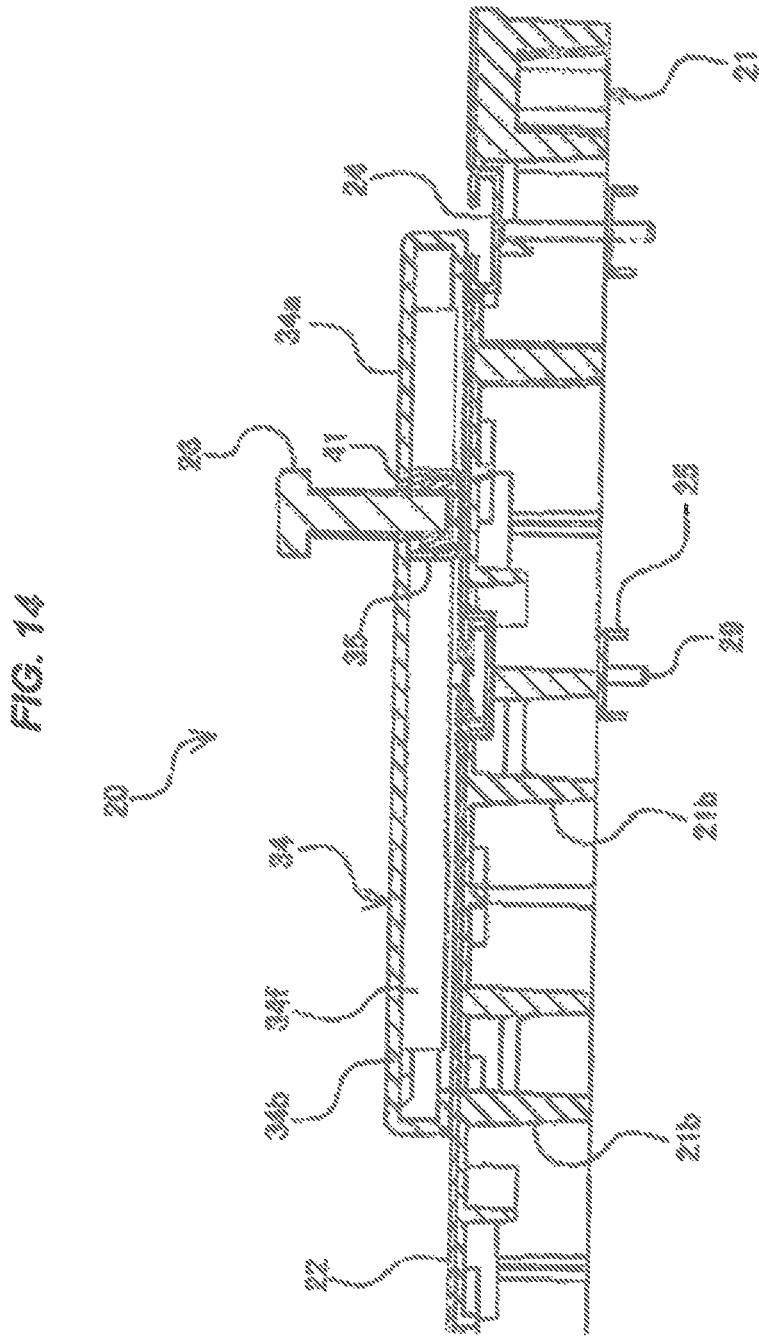

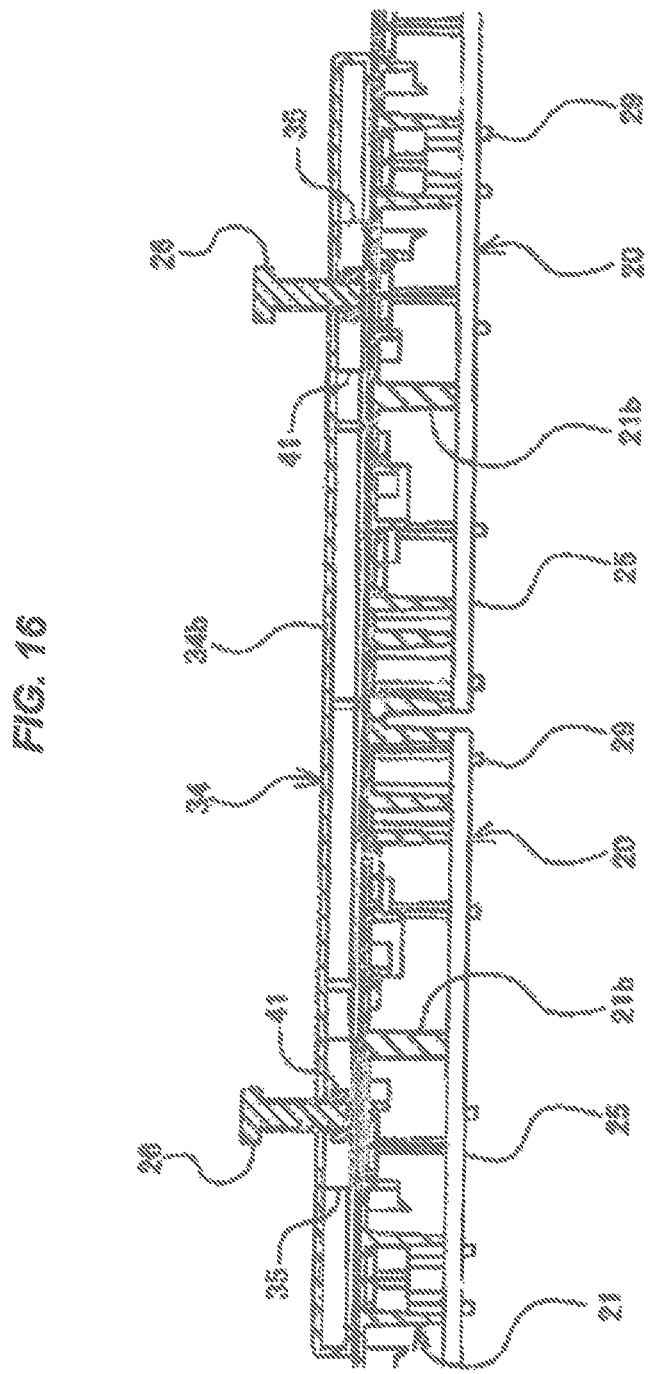

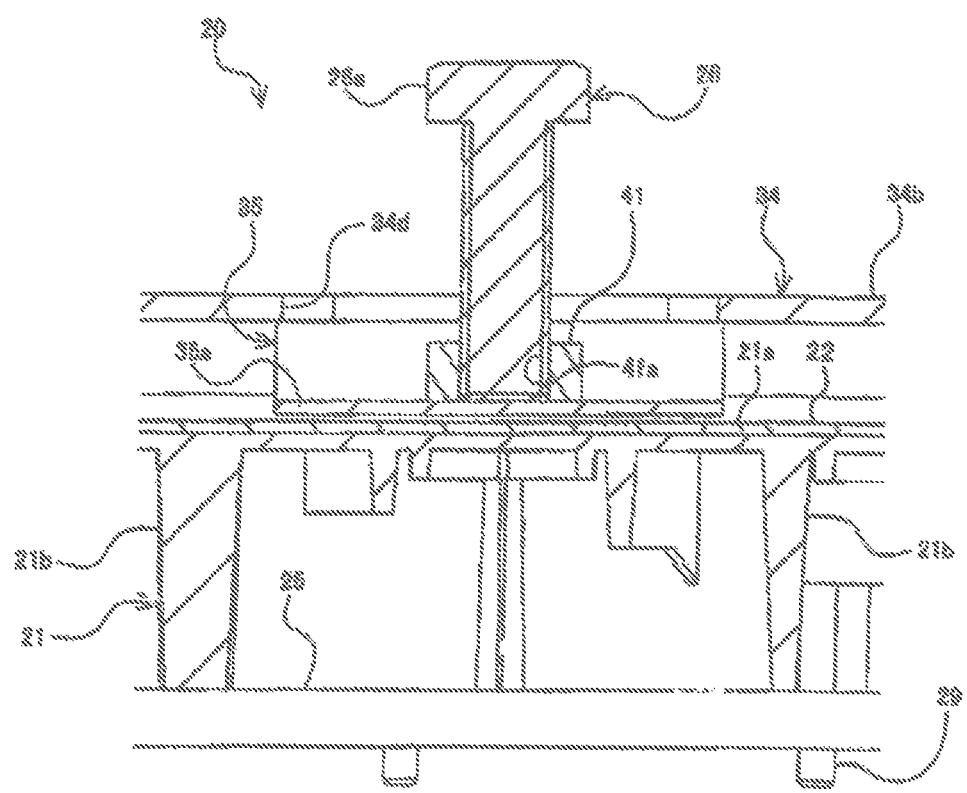

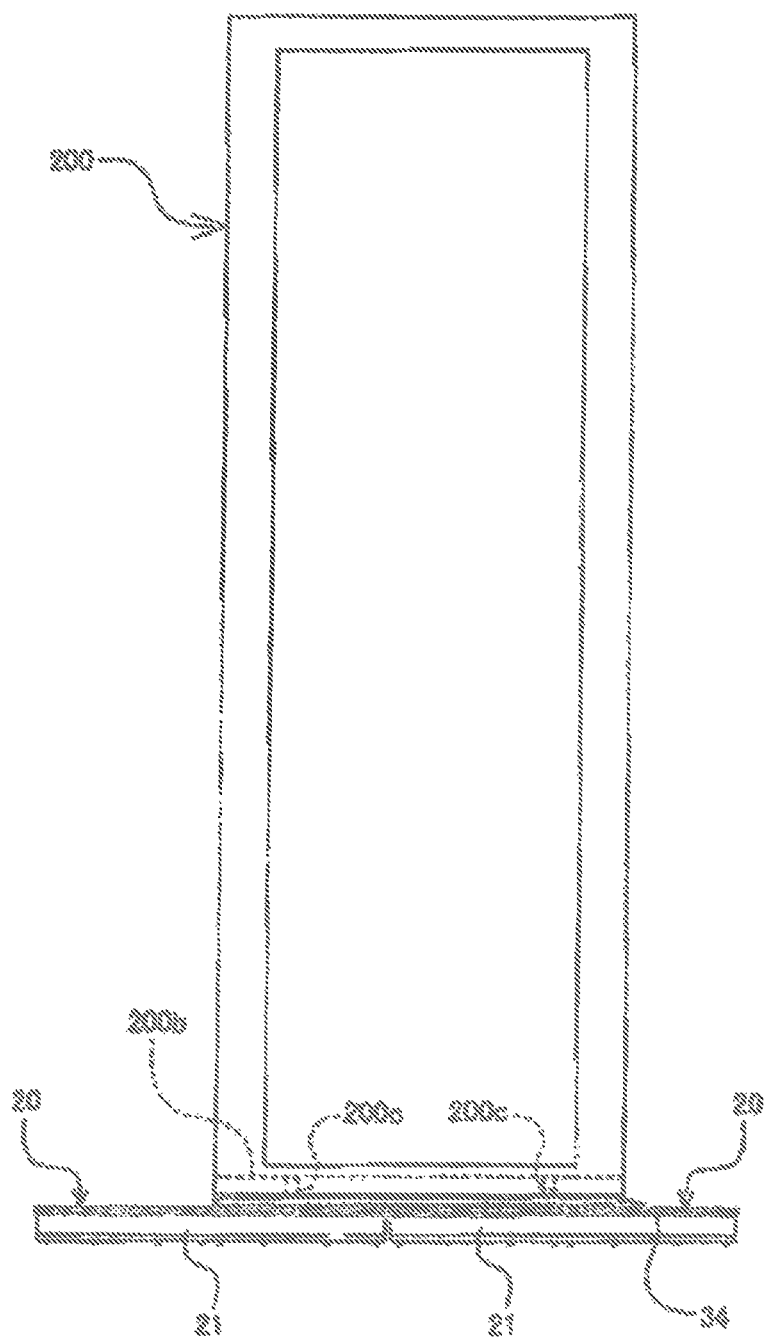

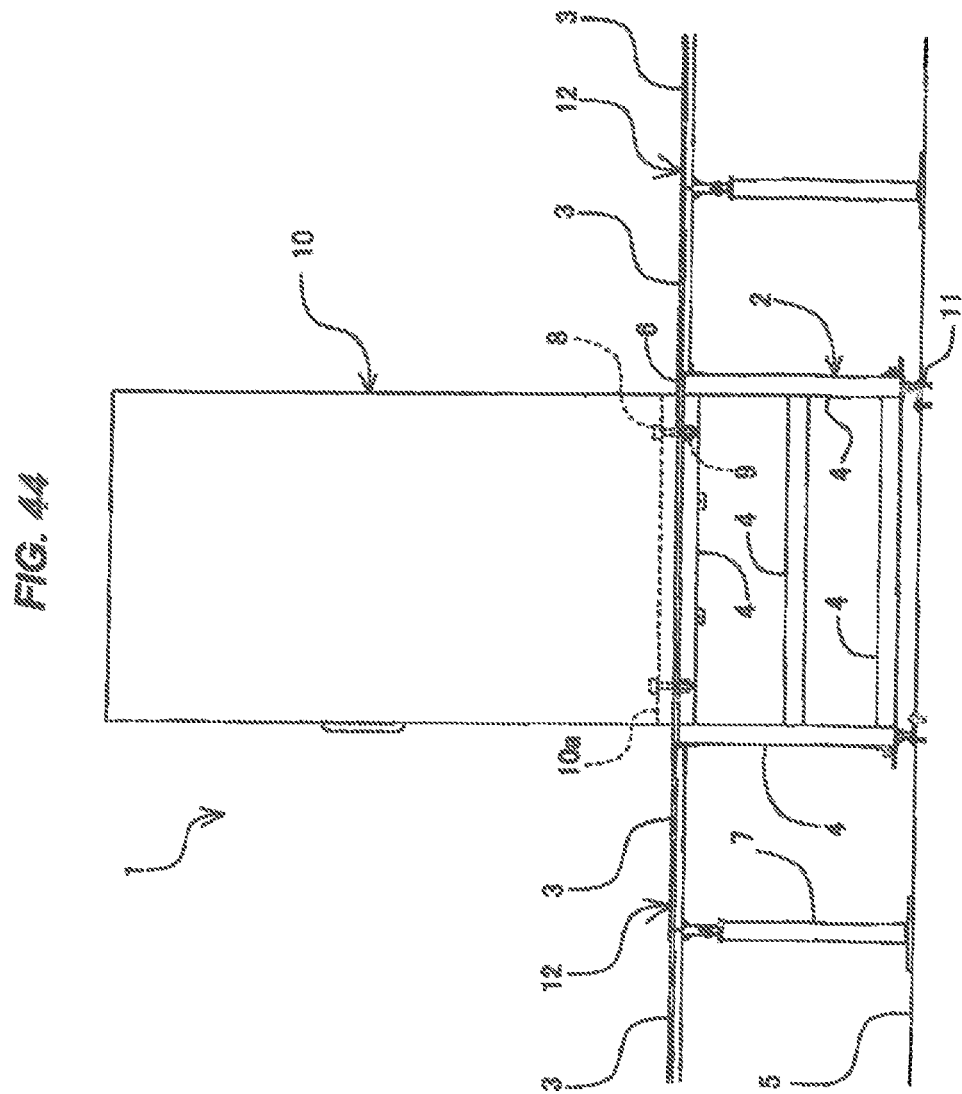

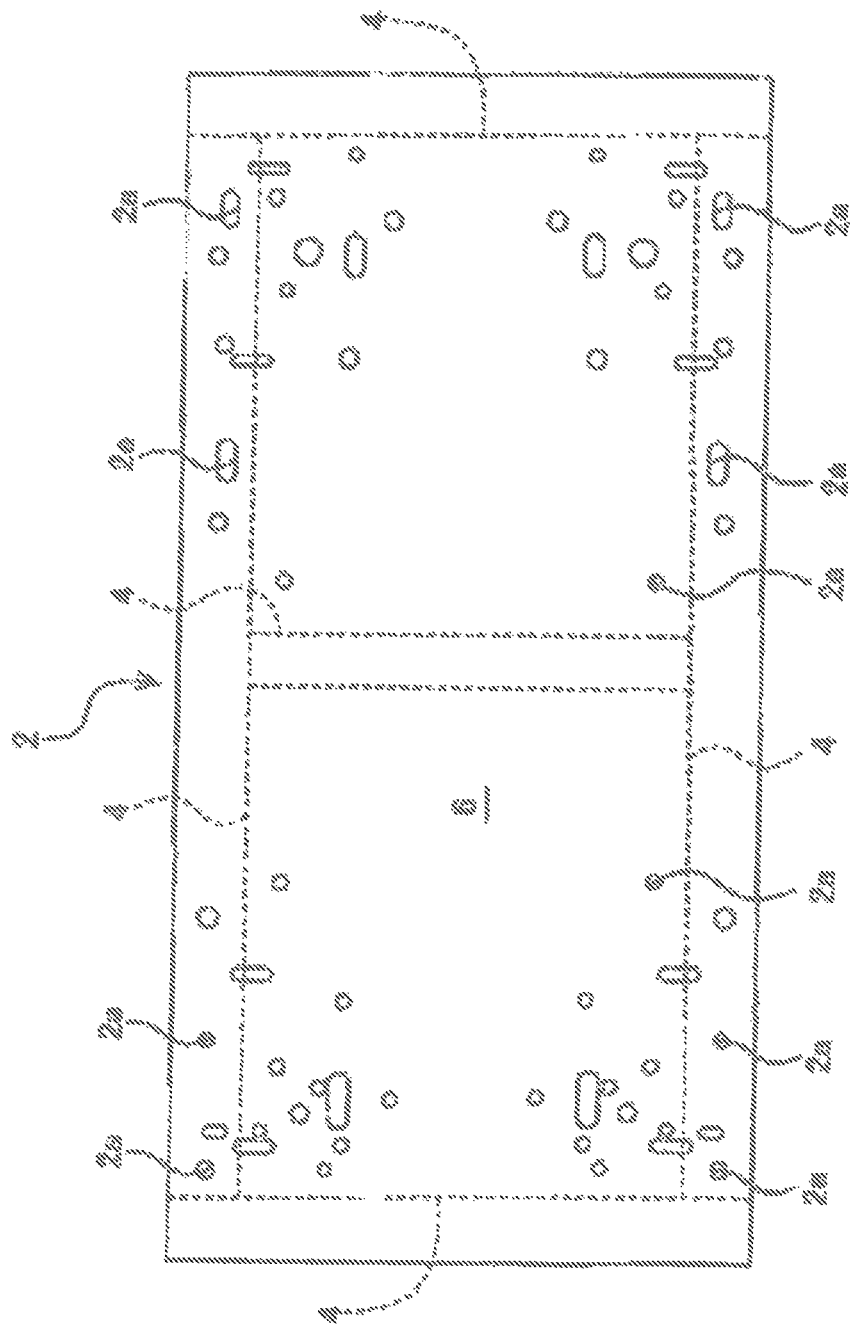

DOUBLE FLOOR MEMBER

TECHNICAL FIELD

The present invention relates to a double floor member such as a floor panel and a frame installed in a free access floor which is laid down on a floor portion of a room such as a data center storing IT devices such as servers.

BACKGROUND ART in recent years, a great amount of data has been processed in the IT devices such as the servers in connection with the coming of an advanced information society, and a lot of IT devices are frequently installed in the data center or the server room so as to be collectively managed.

FIGS. 43 to 45 are views showing for describing a data center 1 according to the prior art. As shown in FIGS. 43 and 44, a free access floor 12 having a double floor structure has been formed in a floor portion of a room in the data center 1, and a plurality of floor panels 3 have been laid down so as to form a floor surface of the free access floor 12 (refer, for example, to patent document 1).

As shown in FIG. 44, the floor panel 3 has been structured such that pipes and wires can be passed in a space between the floor panel 3 and a base floor surface 5 below the floor panel 3 by being horizontally supported at a predetermined height with supporting legs 7 which are provided in a rising manner from the concrete base floor surface 5 and being laid down side by side so as to form the floor surface of the room in the data center 1.

Further, a frame 2 provided in a rising manner from the base floor surface 5 is arranged in a place where the floor panel 3 is not laid down within the data center 1, and a plurality of server racks 10 mounting the servers on shelves in respective stages thereof are mounted on the frame 2 adjacently each other side by side (refer, for example, to patent document 2).

The frame 2 is manufactured such as to have the same height as that of the floor surface of the free access floor 12 (the upper surface of the floor panel 3) and conform to a size (a width and a depth) of the server rack 10 by combining a plurality of L-shaped steel materials (angle members 4) and plate-shaped steel plates (upper plate members 6). Further, leg portions of the frame 2 are fixed onto the base floor surface 5 with anchor bolts 11.

Further, a male thread portion of a fixing bolt 8 is inserted into a through hole formed in each of a bottom plate portion 10a which forms a bottom surface of the server rack 10, and the upper plate member 6 which forms an upper surface of the frame 2.

Further, a lower surface in a head portion of the fixing bolt 8 is engaged with an upper surface of the bottom plate portion 10a of the server rack 10, and an upper surface (a surface in an upper side in FIG. 44) of a fixing nut 9 fastened to a leading end portion of the male thread portion of the fixing bolt 8 is engaged with a lower surface of the upper plate member 6.

As mentioned above, the server rack 10 and the frame 2 are coupled by using the fixing bolt 8 and the fixing nut 9 so as to prevent the server rack 10 from lifting upward from the upper surface of the frame 2 and falling down.

A load of the server rack 10 is not applied to the floor panel 3 but the load can be directly applied to the base floor surface 5 via the frame 2 by arranging the server rack 10 on the frame 2. As a result, it is possible to improve a load bearing property against the load of the server rack 10.

Further, it is possible to prevent the server rack 10 from falling down at the earthquake generating time and it is possible to improve a levelness of the server rack 10, by arranging the server rack 10 on the frame 2, in comparison with a case that the server rack 10 is arranged on the floor panel 3.

CITATION LIST

Patent Literature

PATENT LITERATURE 1: Japanese Unexamined Patent Publication No. 2011-069542
PATENT LITERATURE 2: Japanese Unexamined Patent Publication No. 2003-221924

SUMMARY OF INVENTION

Technical Problem

However, in the data center 1 according to the prior art, the size (the width and the depth) of the server rack 10 is different every product. As a result, the position of the through hole for connecting to the frame 2, which is provided in the bottom plate portion 10a of the server rack 10 for preventing the inversion of the server rack 10 is different every product.

Therefore, as shown in FIG. 45, it is necessary to previously form a lot of through holes 2a for connecting to the server rack 10 in the upper plate member 6 of the frame 2 on the assumption of the position of the through hole provided in the bottom plate portion 10a of the server rack 10 in a horizontal direction.

Further, in the case that the position of the through hole provided in the bottom plate portion 10a of the server rack 10 in the horizontal direction is assumed to be arranged in the peripheral portion of the upper plate member 6 supported by the angle member 4, it is necessary to previously form a lot of through holes 2a for connecting to the server rack 10 so as to pass through both the upper plate member 6 and the angle member 4.

Further, in the case that the through hole provided in the bottom plate portion 10a of the server rack 10 is formed at a position which is not previously assumed, it is necessary to form the through hole 2a for connecting to the server rack 10 in the upper plate member 6 of the frame 2, or both of the upper plate member 6 and the angle member 4 in each case.

As mentioned above, since it is necessary to form the through hole 2a in the frame 2 in correspondence to various kinds of server racks 10, there has been a problem that a cost for the installation work of the server rack 10 becomes expensive, and a construction efficiency is reduced.

Accordingly, the present invention is made by taking the problem mentioned above into consideration, and an object of the present invention is to provide a double floor member which can prevent a cost for an installation work of a server rack from becoming expensive, and can prevent a construction efficiently from being reduced.

Solution to Problem

In order to solve the object mentioned above, according to the present invention, there is provided a double floor member including:

a guide rail which is fixed to an upper surface side:

a first connection member which is movable along a length direction of the guide rail and is engaged with the guide rail so as not to separate upward from the guide rail; and a second connection member which is connected to the first connection member so as not to lift upward from the first connection member, wherein the second connection member is movable in a different direction from the length direction of the guide rail by moving a connection position to the first connection member in a horizontal direction.

Further, according to the present invention, there is provided the double floor member, wherein the second connection member includes a through hole which is formed into a long hole extending approximately vertically to the length direction of the guide rail, wherein the second connection member is connected to the first connection member so as not to lift upward from the first connection member by being threadably fastened to the first connection member with a fixing bolt inserting the long-hole shaped through hole, and wherein the second connection member is movable along a length direction of the long-hole shaped through hole, Further, according to the present invention, there is provided the double floor member, wherein a hole for connecting a casing is formed in the second connection member so as to be connectable via a fixing bolt, Further, according to the present invention, there is provided the double floor member, wherein the hole for connecting the casing is formed into a long hole.

Further, according to the present invention, there is provided the double floor member, wherein the double floor member is a floor panel.

Further, according to the present invention, there is provided the double floor member, wherein the double floor member is a frame.

Effect of the Invention

On the basis of the double floor member according to the present invention, the double floor member includes:

the guide rail which is fixed to the upper surface side;

the first connection member which is movable along the length direction of the guide rail and is engaged with the guide rail so as not to separate upward from the guide rail; and the second connection member which is connected to the first connection member so as not to lift upward from the first connection member, and the second connection member is movable in the different direction from the length direction of the guide rail by moving the connection position to the first connection member in the horizontal direction.

As a result, it is possible to prevent a cost for an installation work of a server rack from being high and it is possible to prevent a construction efficiency from being reduced.

BRIEF DESCRIPTION OF DRAWINGS

FIG. 7 is a cross sectional view of the floor panel 20 shown FIG. 2 as seen from an arrow along a line B-B;

FIG. 8 is an enlarged partial cross sectional view showing a part of FIG. 7 in an enlarged manner;

FIG. 9 is a top elevational view of a connection member 34 shown in FIG. 1;

FIG. 11 is a right side elevational view of the connection member 34 shown in FIG. 9;

FIG. 12 is a cross sectional view of the connection member 34 shown in FIG. 9 as seen from an arrow along a line C-C;

FIG. 13 is a cross sectional view of the connection member 34 shown in FIG. 9 as seen from an arrow along a line D-D;

FIG. 14 is a cross sectional view of the floor panel 20 shown in FIG. 2 as seen from an arrow along a line E-E;

FIG. 16 is a cross sectional view of the floor panel 20 shown in FIG. 2 as seen from an arrow along a line F-F;

FIG. 17 is an enlarged partial cross sectional view showing a part of FIG. 16 in an enlarged manner;

FIG. 18 is a perspective view showing a server rack 200 which is installed to an upper surface of four floor panels 20 shown in FIG. 1;

FIG. 19 is a top elevational view of the server rack 200 which is installed to the upper surface of four floor panels 20 shown in FIG. 18;

FIG. 20 is a front elevational view of the server rack 200 which is installed to the upper surface of four floor panels 20 shown in FIG. 19;

FIG. 44 is a schematically side elevational view showing a state in which a server rack 10 is mounted on a frame 2 in the data center 1 where the floor panel 3 according to the prior art is used; and FIG. 45 is a schematically top elevational view of the frame 2 shown in FIG. 44.

DESCRIPTION OF EMBODIMENTS

Figure 1:
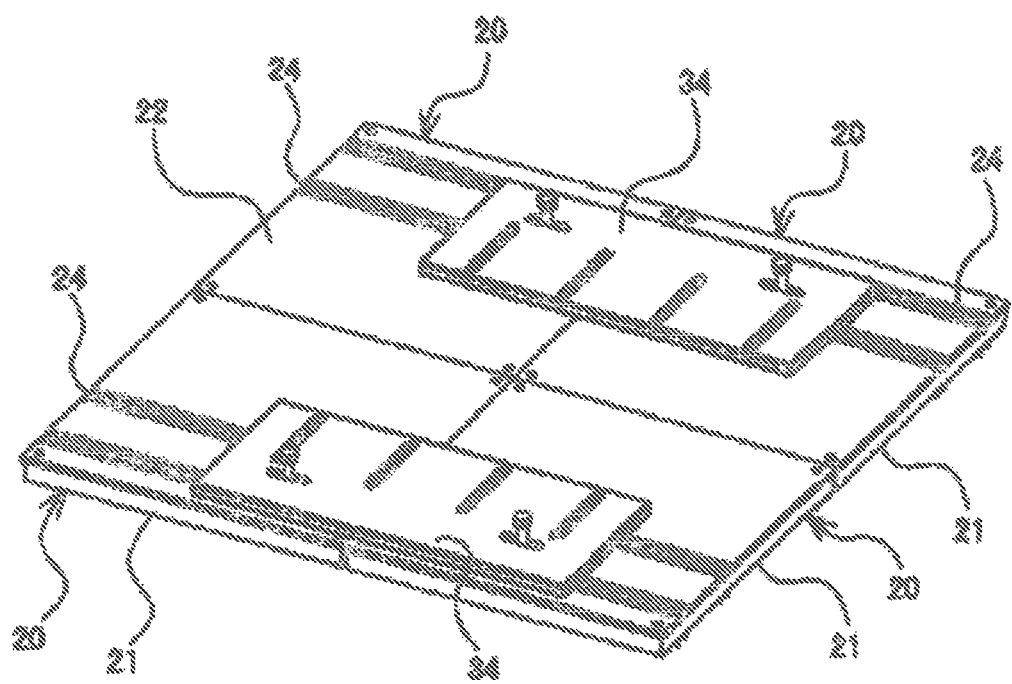
FIG. 1 is a perspective view showing a floor panel 20 according to a first embodiment of the present invention.

A description will be particularly given below of embodiments for carrying out a double floor member according to the present invention with reference to the accompanying drawings.

FIGS. 1 to 22 are drawings which are referred to for describing a floor panel 20 (a double floor member) according to a first embodiment of the present invention.

In the floor panel 20 according to the first embodiment of the present invention, a description will be given by showing four floor panels 20 connected to a server rack 200 in a case that one server rack 200 is installed to an upper surface of the floor panels 20, as shown in FIGS. 18 and 19.

The floor panel 20 according to the present embodiment is constructed by mainly having a panel main body portion 21, a tile 22 which is attached to an upper surface of the panel main body portion 21, a guide rail 24 which is arranged so as to be embedded within the panel main body portion 21, a slide member 27 (a first connection member) which is arranged within the guide rail 24, and a connection member 34 (a second connection member) which is connected to the slide member 27, as shown in FIGS. 1 to 4.

Figure 5:
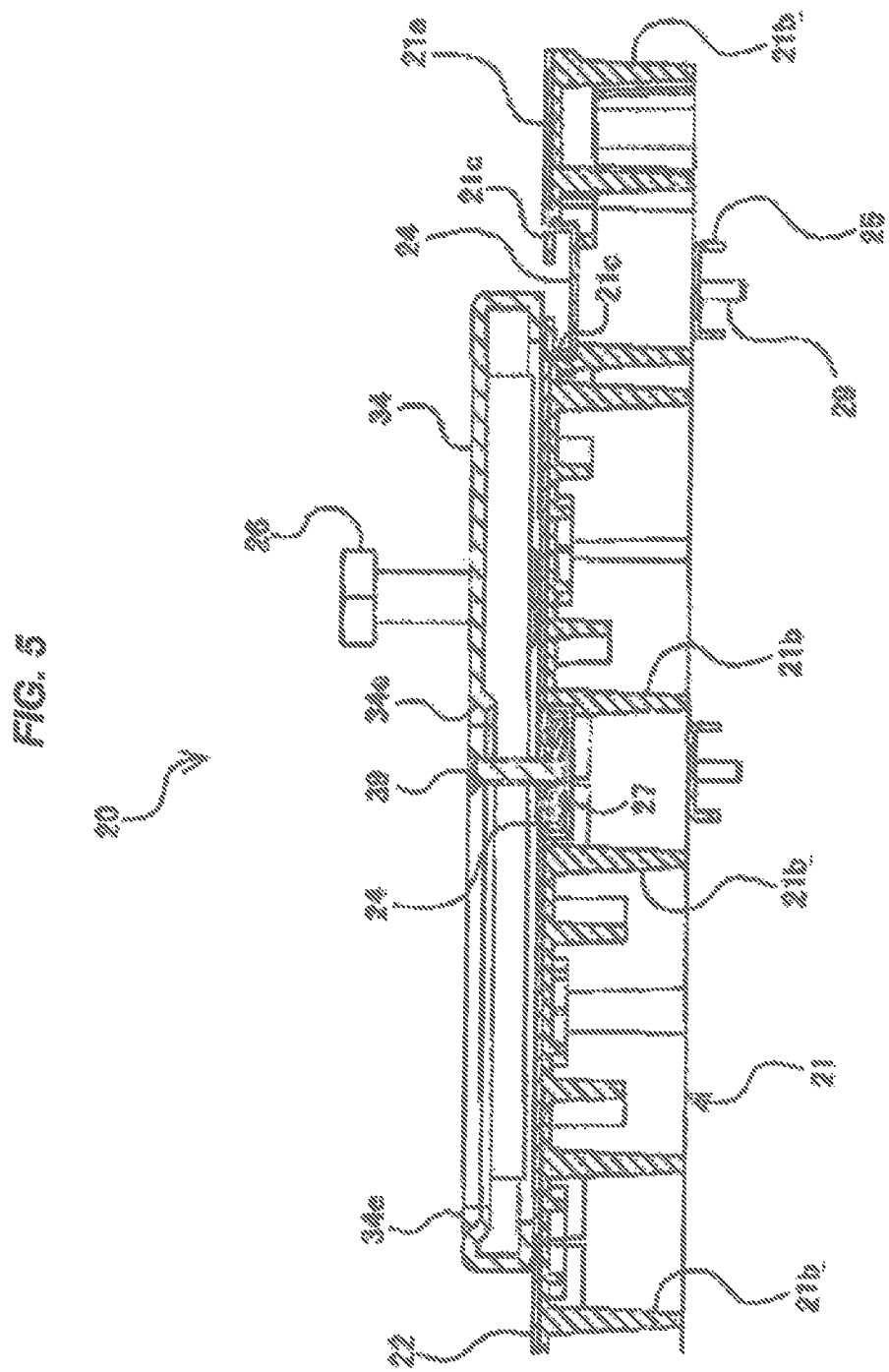
FIG. 5 is a cross sectional view of the floor panel 20 shown in FIG. 2 as seen from an arrow along a line A-A.
Figure 6:
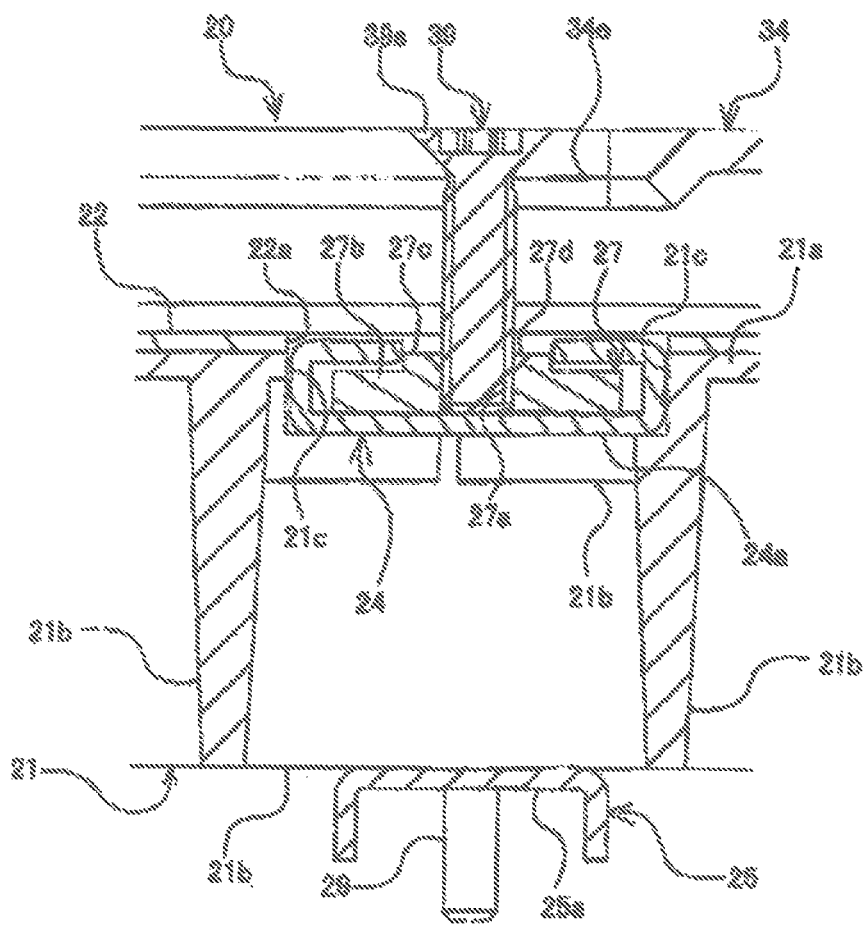
FIG. 6 is an enlarged partial cross sectional view showing a part of FIG. 5 in an enlarged manner.

The panel main body portion 21 is a die casting product which employs an aluminum alloy as its material, and is constructed by having a flat plate portion 21a which forms an upper surface of the panel main body portion 21, and a plurality of ribs 21b which are integrally formed in a back surface side of the flat plate portion 21a (refer to FIGS. 5 and 6).

Each of the plurality of ribs 21b of the panel main body portion 21 protrudes out of the back surface side of the flat plate portion 21a in an underfloor direction (a lower side direction in FIGS. 5 and 6) and is formed into a grid in such a manner that a length is elongated in both vertical and horizontal directions (an up-and-down direction and a right-and-left direction in FIG. 2) along a horizontal surface of the flat plate portion 21a. The panel main body portion 21 is structured such that a strength thereof is improved by forming the plurality of ribs 21b.

Further, a through hole 21c passing through in a thickness direction (an up-and-down direction in the drawing) of the flat plate portion 21a is formed in the flat plate portion 21a of the panel main body portion 21 in such a manner as to elongate in a vertical direction to the paper surface of the drawing as shown in FIG. 6.

The through hole 21c is formed in such a manner as to have a greater opening width than a width (a length in a right-and-left direction of the drawing) of the guide rail 24 in such a manner as to allow the guide rail 24 to be embedded into the panel main body portion 21, as shown in FIG. 6.

Further, as shown in FIGS. 6 and 8, an upper end portion of the rib 21b is scraped away at a position where the rib 21b is formed in a lower side of the through hole 21c, in such a manner as to allow the guide rail 24 to be embedded into the panel main body portion 21.

Since the rib 21b is formed into the grid in such a manner that its length is elongated in both the vertical and horizontal directions along the horizontal surface of the flat plate portion 21a, a lower surface of the bottom plate portion 24a of the guide rail 24 is supported to the upper surface of the plurality of ribs 21b which are scraped away (refer to FIG. 8). As a result, the guide rail 24 is arranged so as not to fall off toward a lower side in FIG. 6.

Further, a tile 22 such as a vinyl chloride P-tile and a high pressure laminate (HPL) tile is attached to an upper surface side of the flat plate portion 21a of the panel main body portion 21, and an outer peripheral portion forming each of sides of the floor panel 20 is machine cut together in a state in which the tile 22 is attached to the flat plate portion 21a of the panel main body portion 21. As a result, the outer peripheral portion of each of the sides of the floor panel 20 is formed with a high dimensional precision (for example, ±0.1 mm or less).

Further, a through hole 22a passing through in a thickness direction of the tile 22 (an up-and-down direction in the drawing) is formed at a position corresponding to the through hole 21c which is formed in the flat plate portion 21a of the panel main body portion 21, as shown in FIG. 6, in such a manner as to be communicated with the through hole 21c.

The guide rail 24 is formed into a C-shaped form (refer to FIG. 6) in its cross sectional shape which is vertical to the length direction thereof by using a steel material as its material, and is embedded into the panel main body portion 21 so as not to protrude out of the upper surface of the tile 22 in a state in which an opening portion of the C-shaped form looks toward an upward direction (an upper side in the drawing) (such a state that the C-shaped form is turned at 90 degree in a counterclockwise direction).

Figure 2:
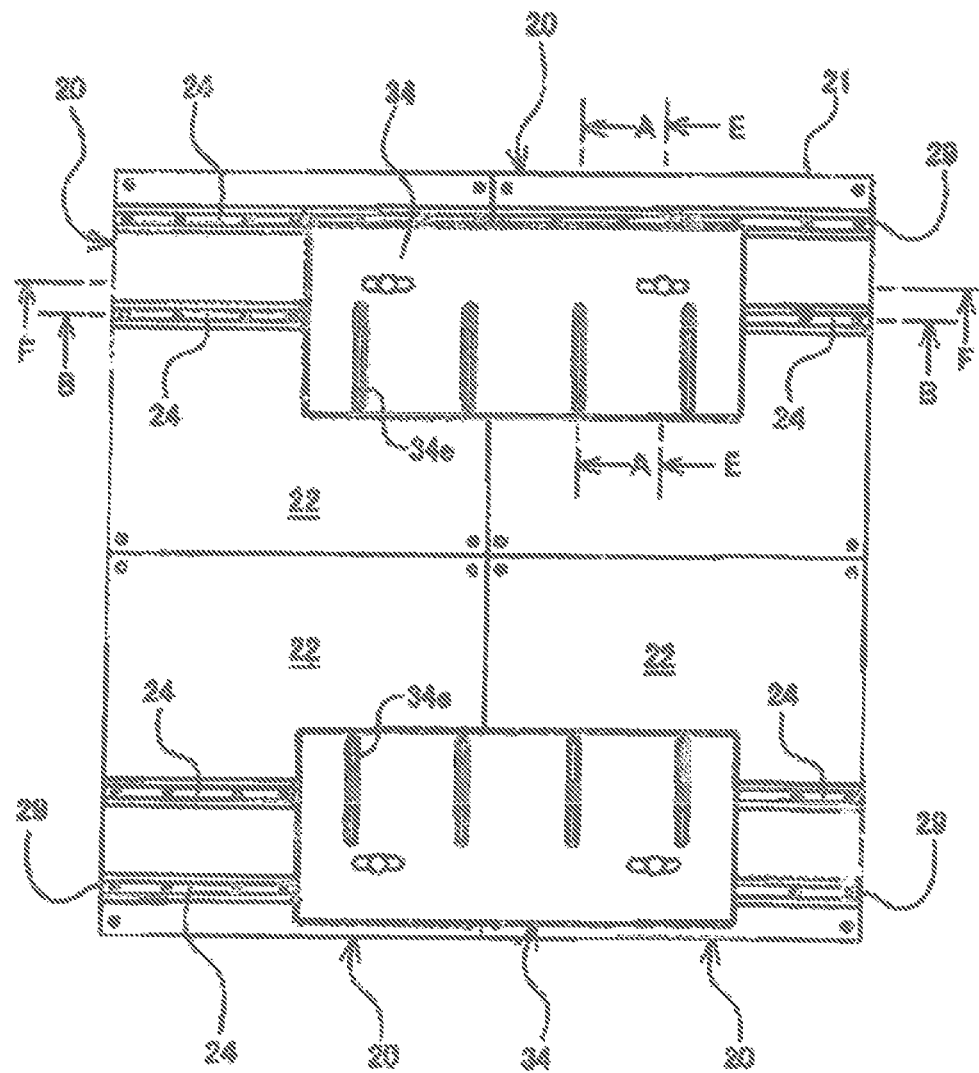
FIG. 2 is a top elevational view of the floor panel 20 shown in FIG. 1.

Further, as shown in FIG. 2, two guide rails 24 provided in one floor panel 20 are arranged so as to extend in a right-and-left direction in the drawing from an approximately right end portion in the drawing of the floor panel 20 over an approximately left end portion in the drawing so that their length directions are in parallel to each other.

Further, the guide rails 24 provided respectively in two floor panels 20 which are adjacent to each other in the right-and-left direction in FIG. 2 are arranged so as to be continuous in the right-and-left direction in FIG. 2 by aligning their positions in the up-and-down direction in FIG. 2.

Further, as shown in FIG. 8, a plurality of through holes 24b formed so that inner peripheral surfaces thereof are inclined are formed in a bottom plate portion 24a (refer to FIG. 6) in an opposite side to the opening portion in the guide rail 24 so as to be spaced at predetermined distances in a length direction of the guide rail 24, each of the through hole 24b passing through in a thickness direction of the bottom plate portion 24a and being smaller in its opening area toward a lower side in FIG. 8.

Further, the through hole 24b of the bottom plate portion 24a is arranged at a position where the rib 21b is not formed in a lower side of the bottom plate portion 24a, as shown in FIG. 8, in such a manner as to prevent a male thread portion 29b of a flat head bolt 29 mentioned later from coming into contact with the rib 21b.

Further, the male thread portion 29b of the flat head bolt 29 is inserted into the through hole 24b of the bottom plate portion 24a as shown in FIG. 8, and a head portion 29a of the flat head bolt 29 is stored within the through hole 24b of the bottom plate portion 24a in such a manner as to prevent an upper surface thereof from protruding out of the upper surface of the bottom plate portion 24a.

Further, as shown in FIGS. 6 and 7, a plate member 25 which is vertical to a length direction thereof and is formed into an inverted U-shaped form in its cross section is arranged in a leading end portion of the rib 21b having the greatest dimension in the length protruding out of the back surface side of the flat plate portion 21a in the underfloor direction (the lower direction in FIG. 6) among the plurality of ribs 21b of the panel main body portion 21 in such a manner that an upper plate portion 25a in an opposite side to an opening portion thereof comes into contact therewith (refer to FIG. 8), The plate member 25 is formed into the inverted U-shaped form (refer to FIG. 6) in a cross sectional shape which is vertical to the length direction. As a result, a strength in the case that the upper plate portion 25a is pulled upward is improved in comparison with the case that the plate member is formed into a tabular shape.

Further, the plate member 25 is formed so as to have approximately the same length as that of the guide rail 24, and is arranged so as to be along the length direction of the guide rail 24 (a right-and-left direction in FIG. 7) in a lower side in a vertical direction of the guide rail 24 (refer to FIG. 6).

Further, a female thread hole 25b passing through in a thickness direction thereof (an up-and-down direction in the drawing) is formed in the upper plate portion 25a of the plate member 25, as shown in FIG. 8, at a position corresponding to the through hole 24b of the bottom plate portion 24a in the guide rail 24.

Further, as shown in FIG. 8, a leading end portion of the male thread portion 29b in the flat bolt 29 protruding downward in the drawing is threadably fastened to the female thread hole 25b of the plate member 25 by inserting into the through hole 24b of the bottom plate portion 24 in the guide rail 24.

Therefore, in the case that the guide rail 24 embedded into the panel main body portion 21 is going to lift upward, an inclined inner peripheral surface of the through hole 24b of the bottom plate portion 24a in the guide rail 24 is engaged with a lower surface of the head portion 29a of the flat head bolt 29, and the upper surface of the upper plate portion 25a in the plate member 25 threadably fastened to the leading end portion of the male thread portion 29b in the flat head bolt 29 is engaged with the lower surface of the rib 21b in the panel main body portion 21. As a result, the guide rail 24 is fixed to the panel main body portion 21 so as not to lift upward, Further, as shown in FIG. 7, four slide members 27 are arranged within the guide rail 24 so as to be movable along a length direction of the guide rail 24 (a right-and-left direction in the drawing).

The slide member 27 is integrally formed so as to have a lower plate portion 27b in a lower side of the drawing, and a protruding portion 27c which protrudes upward from a center portion in the right-and-left direction of the drawing in the lower plate portion 27b, as shown in FIG. 6, by using a steel material as a material thereof. As a result, the slide member 27 is formed into a convex shape (refer to FIG. 6) in a cross sectional shape which is vertical to the length direction of the guide rail 24.

Further, the slide member 27 is arranged within the guide rail 24 in a state in which a lower surface of the lower plate portion 27b comes into contact with the upper surface of the bottom plate portion 24a of the guide rail 24 and the protruding portion 27c is inserted into the opening portion of the guide rail 24, as shown in FIG. 6, Further, as shown in FIG. 6, an opening portion 27d formed so that an inner peripheral surface thereof is inclined is formed in an upper surface side of the slide member 27 in such a manner that an opening area thereof becomes smaller toward a lower side in the drawing. Further, a female thread hole 27a communicating with the opening portion 27d is formed in the slide member 27.

As mentioned above, the head portion 29a (refer to FIG. 8) of the flat head bolt 29 is stored within the through hole 24a of the bottom plate portion 24a in such a manner as to prevent the upper surface thereof from protruding upward from the upper surface of the bottom plate portion 24a in the guide rail 24. As a result, the slide member 27 does not come into collision with the head portion 29a of the flat head bolt 29 in the case that the slide member 27 is moved along the length direction of the guide rail 24, so that the slide member 27 can be moved freely from an end portion in a right side in FIG. 2 of the guide rail 24 to an end portion in a left side in the drawing.

Further, as mentioned above, the guide rails 24 respectively provided in two floor panels 20 which are adjacent to each other in the right-and-left direction of FIG. 2 are arranged so as to be continuous in the right-and-left direction of FIG. 2 by aligning the positions in the up-and-down direction of FIG. 2 each other. As a result, the slide member 27 can move while overstriding between two floor panels 20 which are adjacent to each other in the right-and-left direction of FIG. 2.

Further, a width of the lower plate portion 27b in the slide member 27 (a length in the right-and-left direction of FIG. 6) is formed to be greater than a width of an opening which is open to the upper side of the guide rail 24 (a length in the right-and-left direction of FIG. 6).

As a result, since the upper surface of the lower plate portion 27b engages with the inner peripheral surface in the opening portion side of the guide rail 24 even in the case that the slide member 27 is pulled upward in the drawing, the slide member is restricted to move upward in FIG. 6.

Figure 3:
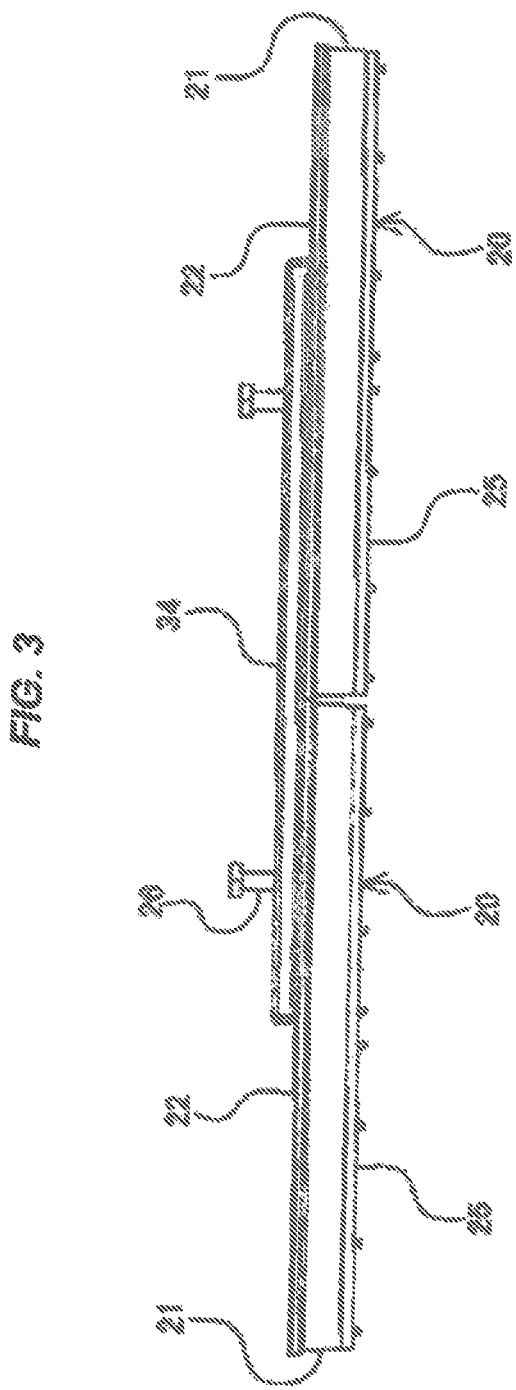
FIG. 3 is a front elevational view of the floor panel 20 shown in FIG. 2.
Figure 4:
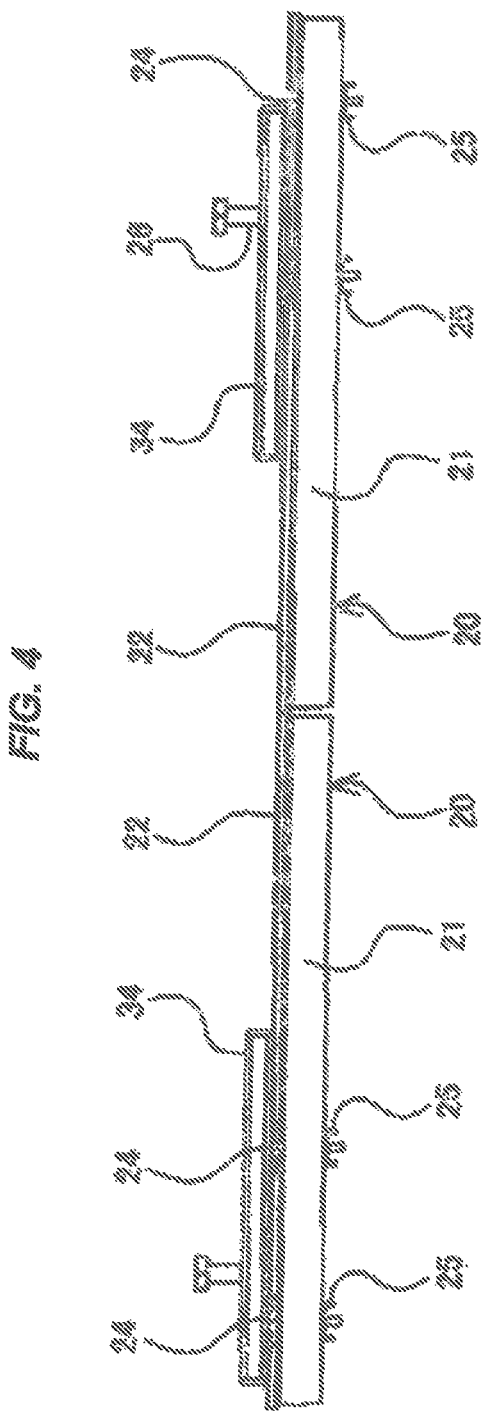
FIG. 4 is a right side elevational view of the floor panel 20 shown in FIG. 2.

As mentioned above, the slide member 27 is formed so as not to get away (separate) from the guide rail 24 through the opening portion of the guide rail 24 even in the case that the slide member 27 is pulled upward in the drawing, Further, as shown in FIGS. 3 and 4, the connection member 34 is arranged in the upper surface of the tile 22 in the floor panel 20. The connection member 34 is formed into an approximately box shape (refer to FIG. 11), as shown in FIG. 9, by having a top plate portion 34b which is formed into a plate shape having an approximately rectangular upper surface 34a, four side plate portions 34c (refer to FIGS. 12 and 13) which are formed by being folded approximately vertically downward from four sides of the top plate portion 34b, and folded portions 34g (refer to FIGS. 12 and 13) which are folded approximately vertically from lower end portions of the side plate portions 34c toward a center side of the connection member 34.

Further, as shown in FIG. 9, two through holes 34d are formed in the connection member 34, the through hole 34d passing through in a thickness direction of the top plate portion 34b (an up-and-down direction in FIG. 12) and having an opening shape extending in the up-and-down direction in the drawing and formed into a long hole.

Further, as shown in FIG. 12, the connection member 34 is provided with a rail member 36 which is bonded to a lower surface 34i of the top plate portion 34b so as to cover the opening portion of the through hole 34d from a lower side in the drawing, and is formed into an approximately U-shaped form in a cross sectional shape which is vertical to the length direction thereof (a right-and-left direction in FIG. 13).

The rail member 35 is formed by a bottom plate portion 35a in an opposite side to the U-shaped opening portion side, and two side plate portions 35b which are folded approximately vertically upward respectively from both end portions in a width direction of the bottom plate portion 35a (the right-and-left direction in FIG. 12) and extend upward in the drawing.

Further, an upper end portion in the drawing of the side plate portion 35b in the rail member 35 is bonded by welding to the lower surface 34i of the top plate portion 34b and an opening portion of the through hole 34d is accordingly covered from a lower side in the drawing over a length direction (an up-and-down direction in FIG. 9).

Further, four through holes 34e are formed in the connection member 34 so as to be spaced at predetermined distances in the up-and-down direction of the drawing, as shown in FIG. 9, the through hole 34e passing through in the thickness direction of the top plate portion 34b (the up-and-down direction in FIG. 13), and having a long-hole shaped opening shape extending in the right-and-left direction of the drawing.

Further, as shown in FIG. 13, a peripheral portion of the through hole 34e in the top plate portion 34b is folded diagonally downward so that a height thereof is reduced toward the through hole 34e. As a result, an inclined surface 34h inclining toward a lower side in the drawing from the upper surface 34a is formed in the top plate portion 34b to be along the through hole 34e extending in the right-and-left direction in FIG. 9, so that a height thereof is reduced toward the through hole 34e.

Figure 10:
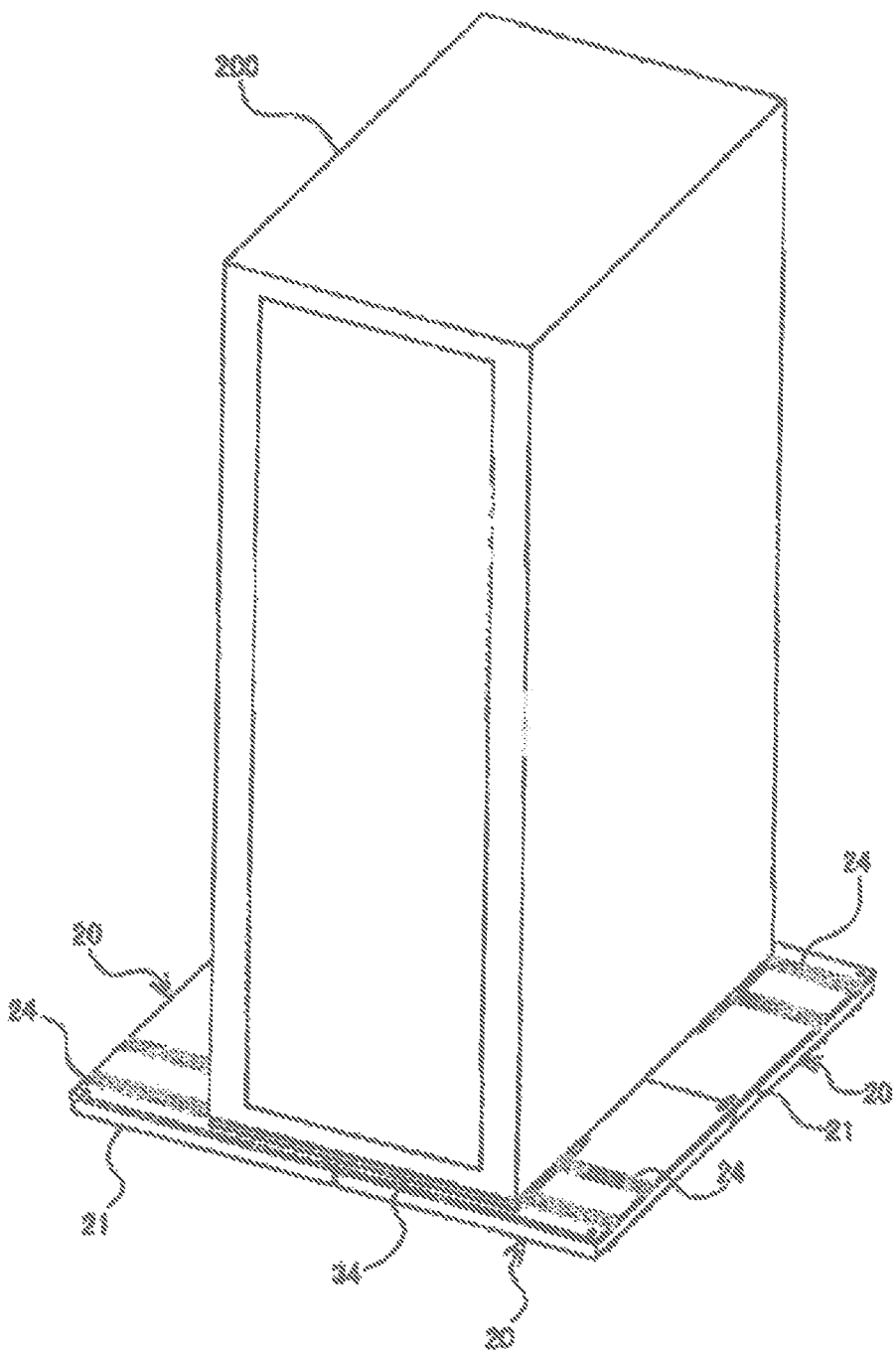
FIG. 10 is a bottom elevational view of the connection member 34 shown in FIG. 9.
Figure 10:
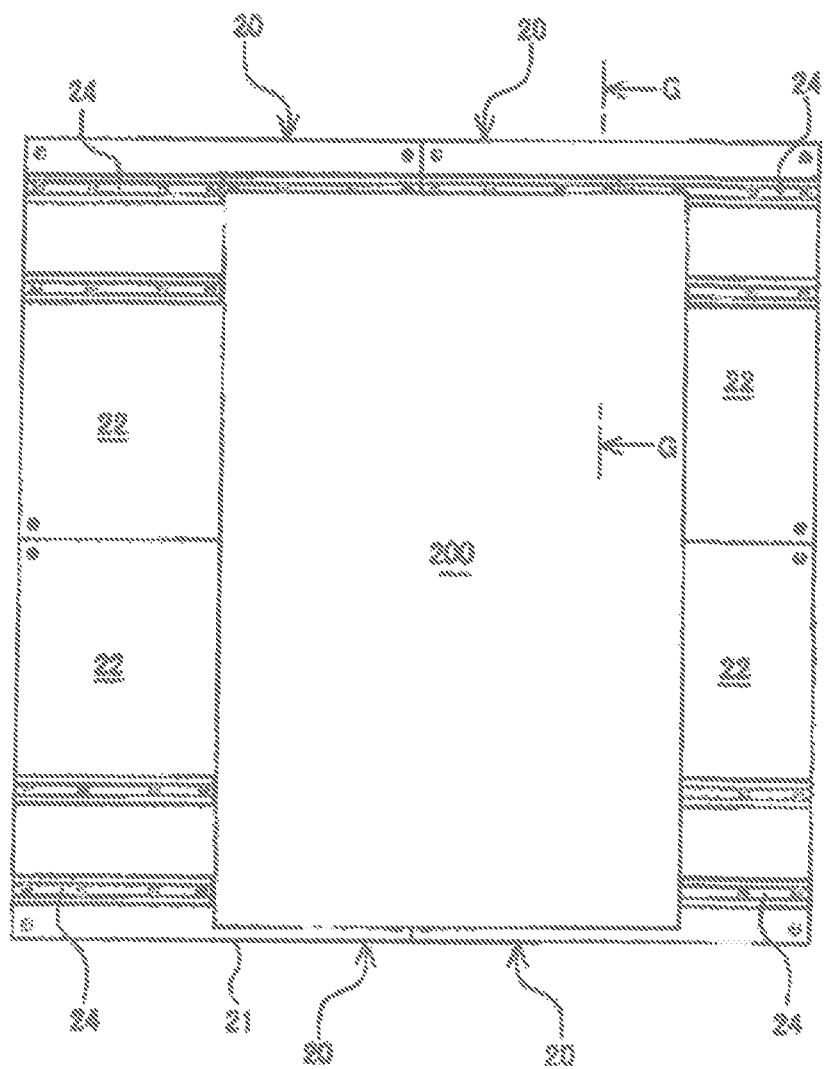
Figure 21:
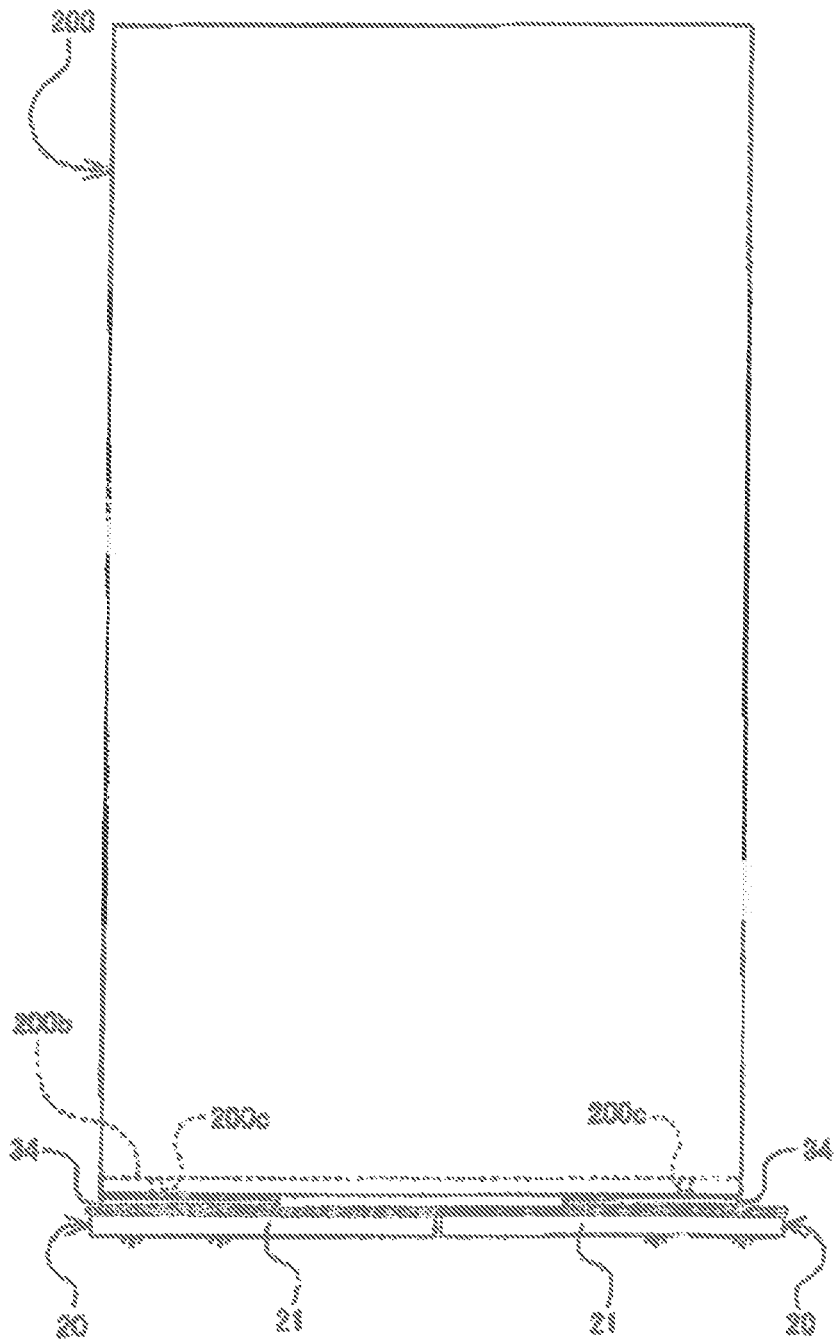
FIG. 21 is a right side elevational view of the server rack 200 which is installed to the upper surface of four floor panels 20 shown in FIG. 19.

Further, as shown in FIG. 10, a plate-shaped rib 34f formed into an approximately rectangular shape in a cross sectional shape which is vertical to the length direction (refer to FIG. 13) is bonded between two through holes 34e which are adjacent to each other, in the lower surface 34i of the top plate portion 34b, so as to be approximately in parallel to the length direction of the through hole 34e, Further, the connection member 34 is arranged so that four through holes 34e each formed into a long hole which is longer in the right-and-left direction in FIG. 9 are respectively communicated with female through holes 27a and opening portions 27d (refer to FIGS. 6 and 8) of four slide members 27 (refer to FIG. 7) arranged within the guide rail 24.

Further, as shown in FIG. 8, a leading end portion of the male thread portion 39b of the flat head bolt 39 (the fixing bolt) is inserted into the through hole 34e of the connection member 34 and the opening portion (refer to FIG. 6) of the guide rail 24 and is threadably fastened to the female thread hole 27a of the slide member 27. As a result, the connection member 34 is connected to the slide member 27 which is movable along the guide rail 24.

Therefore, in the case that the connection member 34 is pulled upward, the inclined surface 34h of the top plate portion 34b comes into contact and engages with the head portion 39a of the flat head bolt 39, and the slide member 27 to which the male thread portion 39b of the flat head bolt 39 is threadably fastened is formed so as not to get away from the guide rail 24 even in the case of being pulled upward. As a result, the connection member 34 is structured such as to be prevented from lifting up from the guide rail 24 and being away from the guide rail 24.

Further, as mentioned above, a peripheral portion of the through hole 34e (refer to FIG. 13) in the top plate portion 34b of the connection member 34 is folded diagonally downward so that a height is reduced toward the through hole 34e, and the inclined surface 34h is formed in the top plate portion 34b of the connection member 34. As a result, the head portion 39a of the flat head bolt 39 is arranged so as to prevent an upper end portion thereof from protruding upward from the upper surface 34a of the top plate portion 34b (refer to FIG. 8).

Further, since the through hole 34e of the connection member 34 is formed into the long hole so as to be longer in the vertical direction (refer to FIG. 2) in relation to the length direction of the guide rail 24 as shown in FIG. 9, it is possible to move the position of the connection member 34 in the up-and-down direct in FIG. 2 along the length direction of the through hole 34e.

As a result, the connection member 34 connected to the slide member 27 which is movable along the length direction of the guide rail 24 can move along the length direction of the guide rail 24, and can move along the direction which is vertical to the length direction of the guide rail 24 (the length direction of the through hole 34e in the connection member 34).

Figure 15:
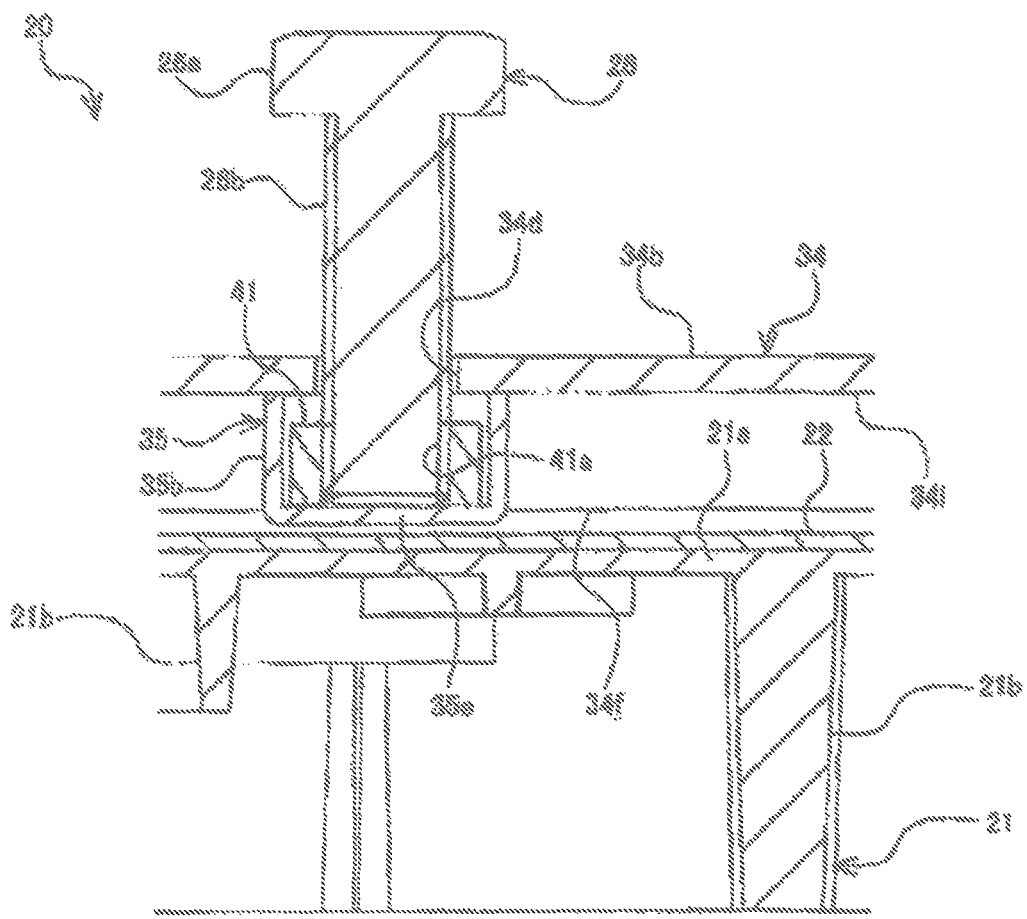
FIG. 15 is an enlarged partial cross sectional view showing a part of FIG. 14 in an enlarged manner.

Further, a nut member 41 is arranged within the rail member 35 (refer to FIG. 12) of the connection member 34, the nut member 41 being movable along a length direction of the rail member 35 (a right-and-left direction in FIG. 16), as shown in FIGS. 14 and 15.

As shown in FIG. 15, a diameter of the nut member 41 is formed to be smaller than a width (a length in a right-and-left direction of FIG. 15) of the bottom plate portion 35a of the rail member 35, and be larger than a width (a length in the right-and-left direction of FIG. 15) of the opening of the through hole 34d in the connection member 34.

As a result, the nut member 41 is formed so that an upward movement thereof in FIG. 15 is restricted by engagement with the lower surface 34i of the top plate portion 34b, and the nut member 41 does not get away from the rail member 35 through the opening portion of the through hole 34d even in the case that the nut member 41 is pulled upward in FIG. 15.

Further, as shown in FIG. 15, the leading end portion of the male thread portion 26b in the fixing bolt 26 inserted through the through hole 34d of the connection member 34 can be threadably fastened to the ferrule thread portion 41a of the nut member 41.

As shown in FIGS. 18 to 21, a server rack 200 (a casing) is mounted to the upper surface 34a (refer to FIG. 9) of the connection member 34 in the floor panel 20. Further, a through hole 200c is formed in a bottom plate portion 200b forming a bottom surface of the server rack 200, the through hole 200c passing through in a thickness direction (an up-and-down direction in the drawing) of the bottom plate portion (refer to FIG. 22).

Figure 22:
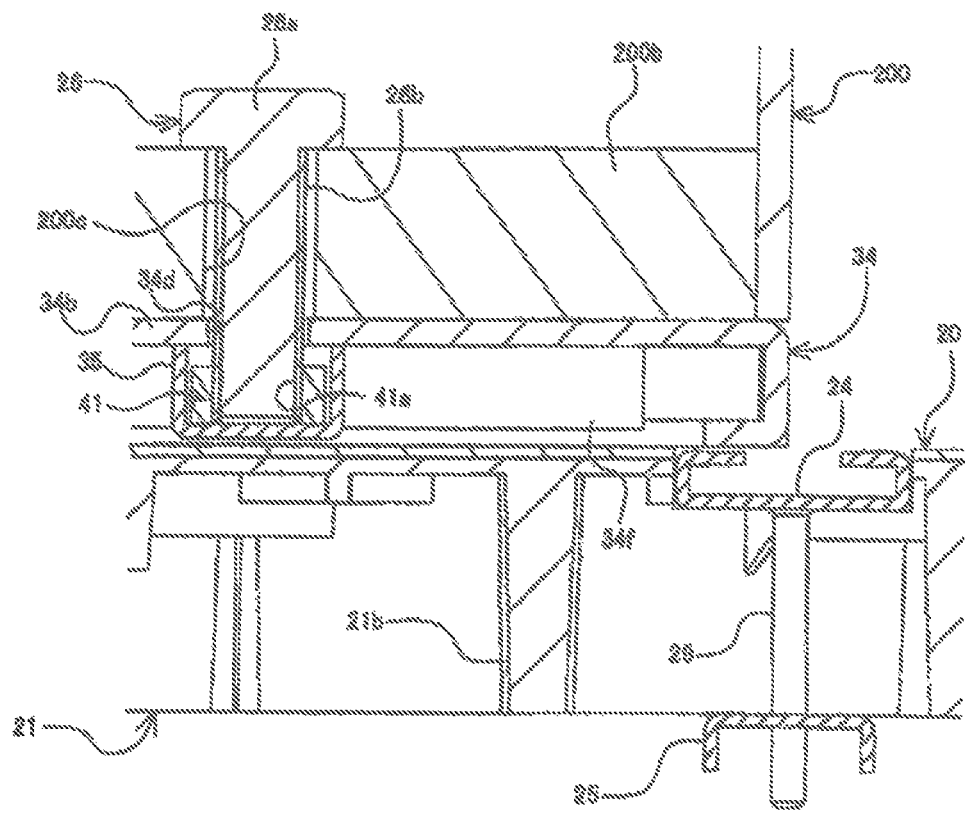
FIG. 22 is a cross sectional view as seen from an arrow along a line G-G and shows a connection portion between the floor panel 20 and the server rack 200 in the server rack 200 which is installed to the upper surface of the floor panels 20 shown in FIG. 19 in an abbreviating manner.

As shown in FIG. 22, a lower surface of the head portion 26a of the fixing bolt 26 comes into contact and engages with an upper surface of the bottom plate portion 200b of the server rack 200, and a leading end portion of the male thread portion 26b of the fixing bolt 26 is inserted into the through hole 200c of the server rack 200 and the through hole 34d (refer to FIG. 12) of the connection member 34 and is threadably fastened to the female thread portion 41a of the nut member 41.

As mentioned above, the lower surface of the head portion 26a of the fixing bolt 26 engages with the upper surface of the bottom plate portion 200b of the server rack 200, and the male thread portion 26b of the fixing bolt 26 is threadably fastened to the nut member 41 which is provided so as not to get away upward from the rail member 35. As a result, the server rack 200 is connected to the floor panel 20 via the fixing bolt 26 so as to be prevented from lifting upward from the upper surface 34a (refer to FIG. 9) of the connection member 34 in the floor panel 20 and falling down.

Further, since the top plate portion 34b is provided with a reinforcing rib 34f (refer to FIG. 10), the top plate portion 34b is hard to be broken in the case that the server rack 200 lifts upward from the upper surface 34a (refer to FIG. 9) of the connection member 34 and the top plate portion 34b is pulled upward by the fixing bolt 26.

In the case that the position of the nut member 41 in the right-and-left direction in FIG. 16 does not come into line with the through hole 200c of the server rack 200 connected to the connection member 34 in the floor panel 20, the position of the nut member 41 can be aligned with the position of the through hole 200c of the server rack 200 by moving the connection member 34 along the length direction (the right-and-left direction in FIG. 2) of the guide rail 24.

Further, in the case that the position of the nut member 41 in the right-and-left direction in FIG. 14 does not come into line with the through hole 200c of the server rack 200 connected to the connection member 34 in the floor panel 20, the position of the nut member 41 can be aligned with the position of the through hole 200c of the server rack 200 by moving the connection member 34 along the length direction of the long-hole shaped through hole 34e extending in the up-and-down direction in FIG. 2.

Further, the guide rails 24 in the first column and the fourth column in the up-and-down direction in FIG. 2 are not used in four floor panels 20 shown in FIG. 2, and the connection member 34 is connected to the slide members 27 (refer to FIG. 7) which are arranged within the guide rails 24 in the second column and the third column in the up-and-down direction in the drawing.

As a result, in the case that the position of the nut member 41 in the right-and-left direction in FIG. 14 does not come into line with the through hole 200c of the server rack 200 connected to the floor panel 20, the position of the nut member 41 in the right-and-left direction in FIG. 14 can be changed by arranging four slide members 27 within the guide rails 24 in the first column and the fourth column in the up-and-down direction in FIG. 2 and connecting the connection member 34 to four slide members 27.

Further, in the case that the positions of the nut members 41 arranged within two rail members 35 (refer to FIG. 16) in the right-and-left direction in FIG. 16 are aligned with the positions of the through holes 200c (two through holes 200c shown in a right side and a left side in FIG. 20) which are formed respectively in two corner portions of the server rack 200 in a width direction, the positions of the nut members 41 can be aligned with the positions of the through holes 200c of the server rack 200 by moving the nut members 41 along the length direction (the right-and-left direction in FIG. 16) of the rail member 35.

Therefore, for example, in the case that the position of the through hole 200c of the server rack 200 in the right-and-left direction in FIG. 20 is formed further closer to the corner portion (an outer side in the right-and-left direction in FIG. 20), the position of the nut member 41 can be aligned with the position of the through hole 200c of the server rack 200 by moving the nut member 41 along the length direction of the rail member 35, in the direction that two nut members 41 shown in FIG. 16 come away from each other in the right-and-left direction in the drawing.

Since the size (the width and the depth) of the server rack 200 is different every product as mentioned above, the position of the nut member 41 threadably fastened to the fixing bolt 26 in the horizontal direction can be aligned with the position of the through hole 200c of the server rack 200 in the horizontal direction by moving the connection member 34 along the length direction of the guide rail 24, moving the connection member 34 along the length direction of the through hole 34e, changing the guide rail 24 connecting the connection member 34 to the different guide rail 24, or moving the nut member 41 along the length direction of the rail member 35, even in the case that the position of the through hole 200c of the server rack 200 is different every product.

Therefore, in the case that the floor panel 20 according to the present embodiment is employed for the installation work of the server rack 200, it is not necessary to previously form a lot of through holes for fixing the server rack 200 in the floor panel 20 by assuming the positions of the through holes 200c in the horizontal direction, the through holes 200c being different every product of the server rack 200.

Further, in the case that the floor panel 20 according to the present embodiment is employed for the installation work of the server rack 200, it is not necessary to form the through hole for fixing the server rack 200 in the floor panel 20 in each case that the positions of the through holes 200c in the horizontal direction can not be previously assumed, the through holes 200c being different every product of the server rack 200.

Therefore, in the case that the floor panel 20 according to the present embodiment is employed for the installation work of the server rack 200, it is possible to prevent the cost for the installation work of the server rack 200 from being high, and it is possible to prevent the execution efficiency from being reduced FIGS. 23 to 26 are views which are referred to for describing a floor panel 50 (a double floor member) according to a second embodiment of the present invention.

The floor panel 50 according to the present embodiment is different from the floor panel 20 according to the first embodiment in a point that a connection member 54 (a second connection member) is provided in place of the connection member 34 in the floor panel 20 according to the first embodiment.

Figure 23:
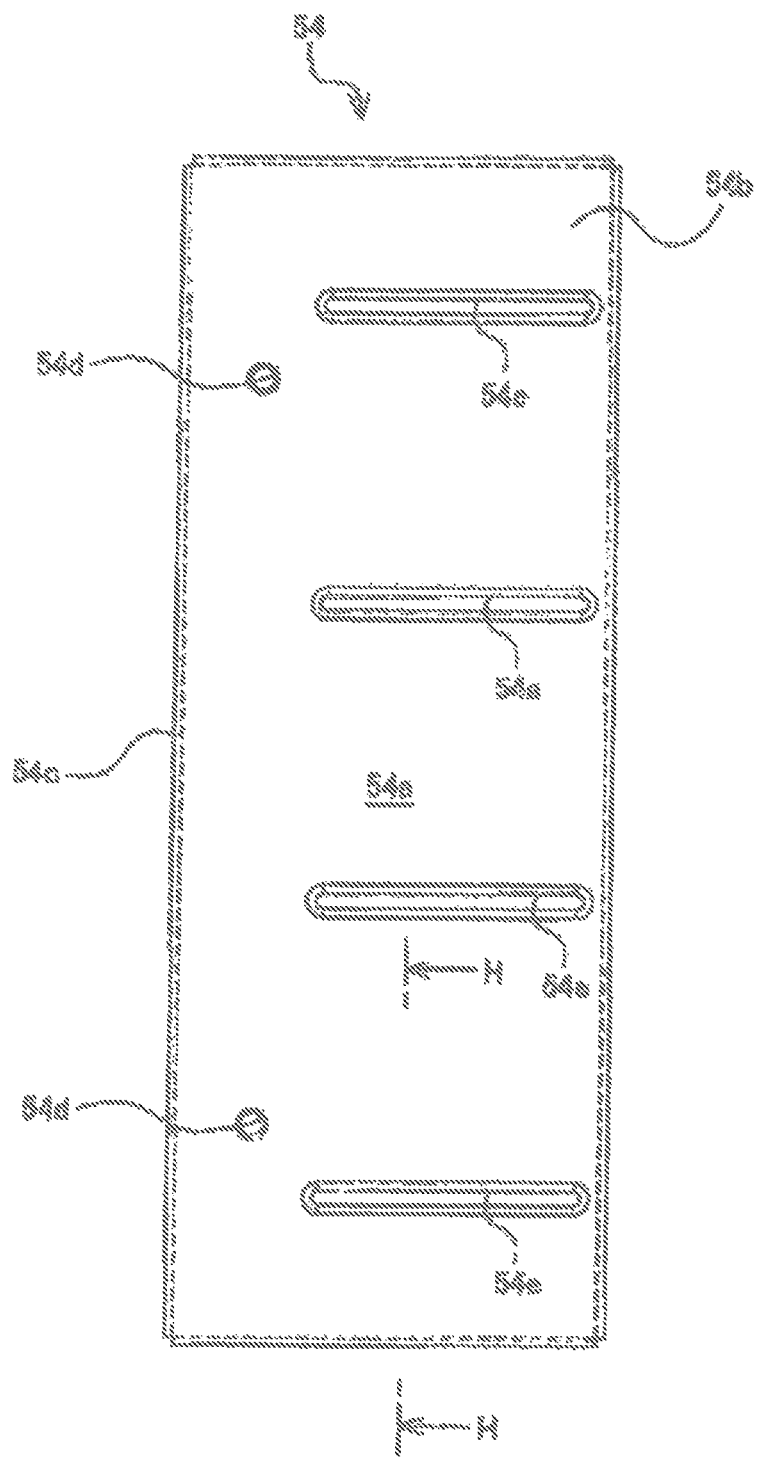
FIG. 23 is a top elevational view of a connection member 54 in a floor panel 50 according to a second embodiment of the present invention.
Figure 24:
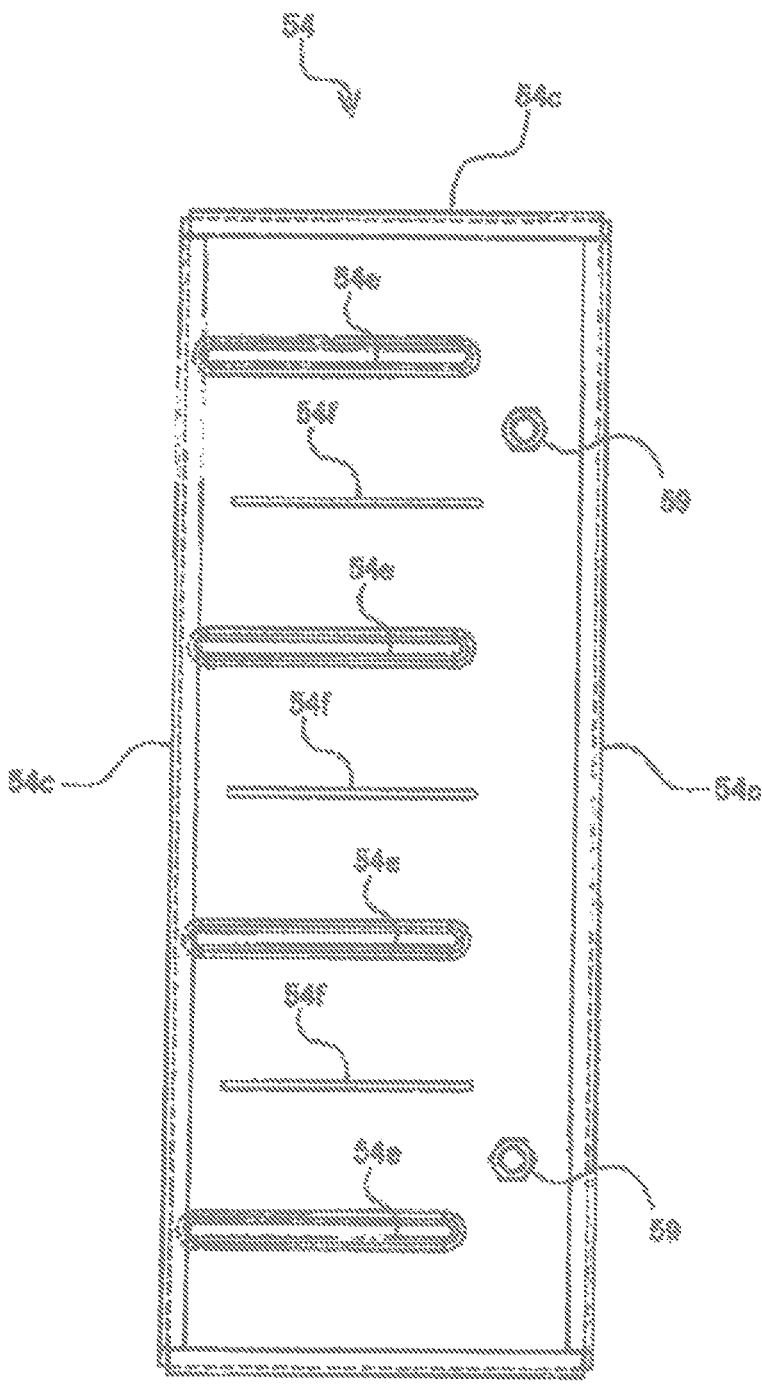
FIG. 24 is a bottom elevational view of the connection member 54 shown in FIG. 23.
Figure 25:
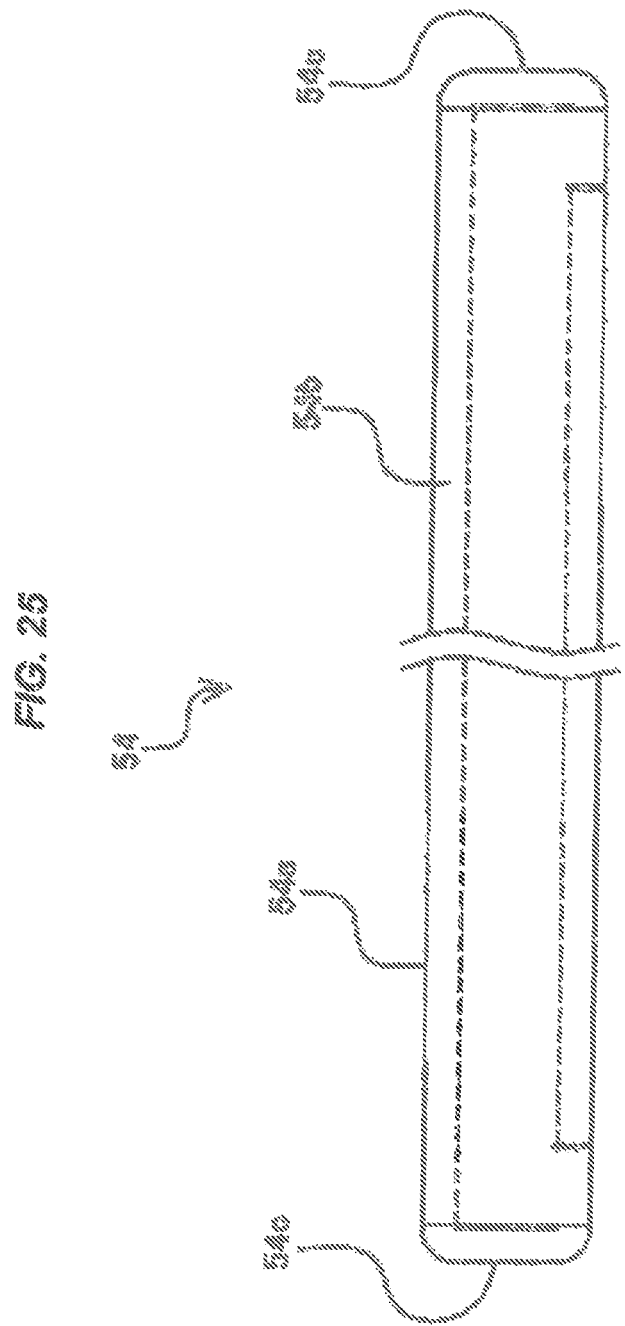
FIG. 25 is a right side elevational view showing a part of the connection member 54 shown in FIG. 23 in an abbreviating manner.

In the connection member 34 of the floor panel 20 according to the first embodiment, two through holes 34d having the long-hole shaped opening shape are formed in the top plate portion 34b, however, two round-hole shaped through holes 54d are formed in the connection member 54 of the floor panel 50 according to the present embodiment as shown in FIG. 23.

Figure 26:
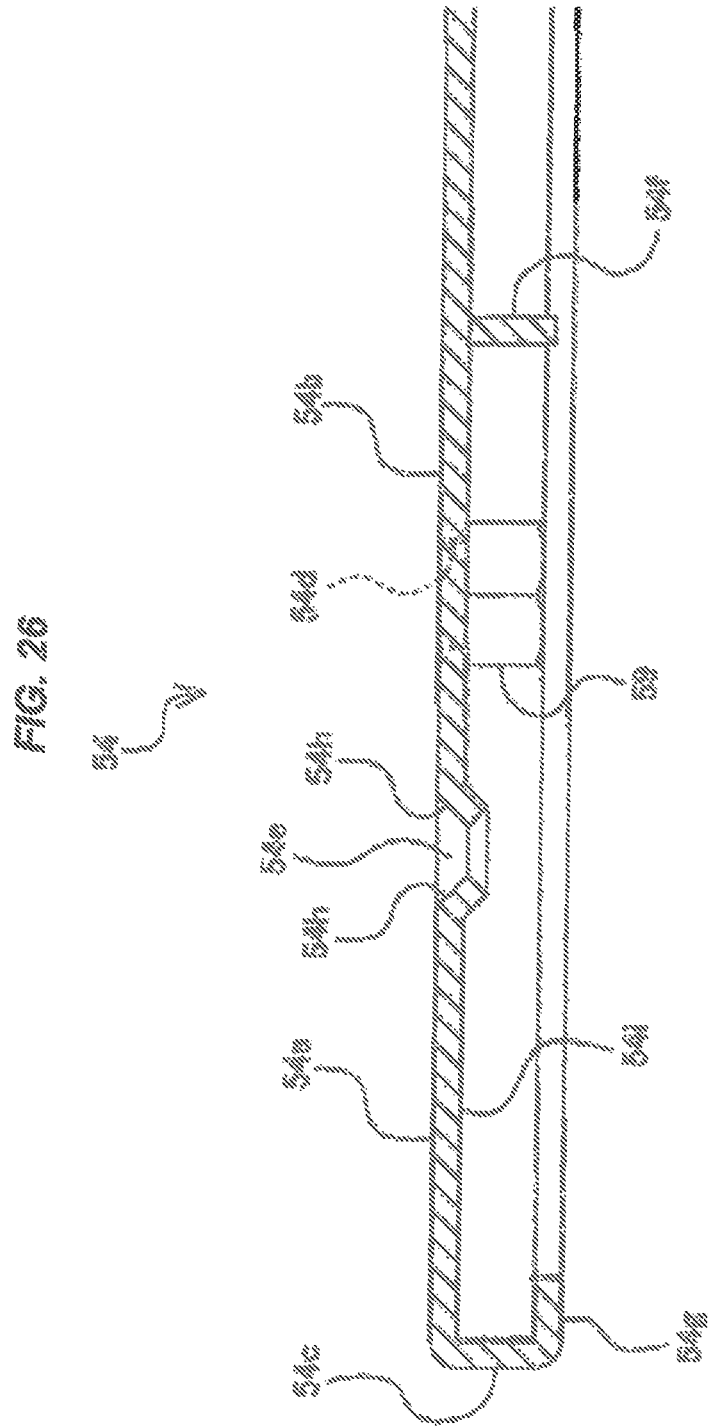
FIG. 26 is a cross sectional view of the connection member 54 shown in FIG. 23 as seen from an arrow along a line H-H.

Further, in the connection member 34 of the floor panel 20 according to the first embodiment, the rail member 35 is bonded to the lower surface 34i of the top plate portion 34b so as to cover the opening portion of the through hole 34d from the lower side in the drawing as shown in FIG. 12. However, in the connection member 54 of the floor panel 50 according to the present embodiment, a nut member 59 is bonded by welding to a position where a through hole 54d in a lower surface 54i of a top plate portion 54b is formed, as shown in FIG. 26.

Further, in the floor panel 20 according to the first embodiment, the leading end portion of the male thread portion 26b in the fixing bolt 26 is threadably fastened to the female thread portion 41a of the nut member 41 as shown in FIG. 22. In the same manner, the leading end portion of the male thread portion 26b in the fixing bolt 26 is structured such as to be inserted into the through hole 54d of the connection member 54 and be threadably fastened to the nut member 59 (refer to FIG. 26).

The other structures are the same as those of the floor panel 20 according to the first embodiment.

The same effects as those of the floor panel 20 according to the first embodiment can be also obtained by the floor panel 50 according to the present embodiment mentioned above.

FIGS. 27 to 31 are views which are referred to for describing a floor panel 70 (a double floor member) according to a third embodiment of the present invention, The floor panel 70 according to the present embodiment is different from the floor panel 20 according to the first embodiment in a point that a connection member 74 (a second connection member) is provided in place of the connection embodiment.

Figure 27:
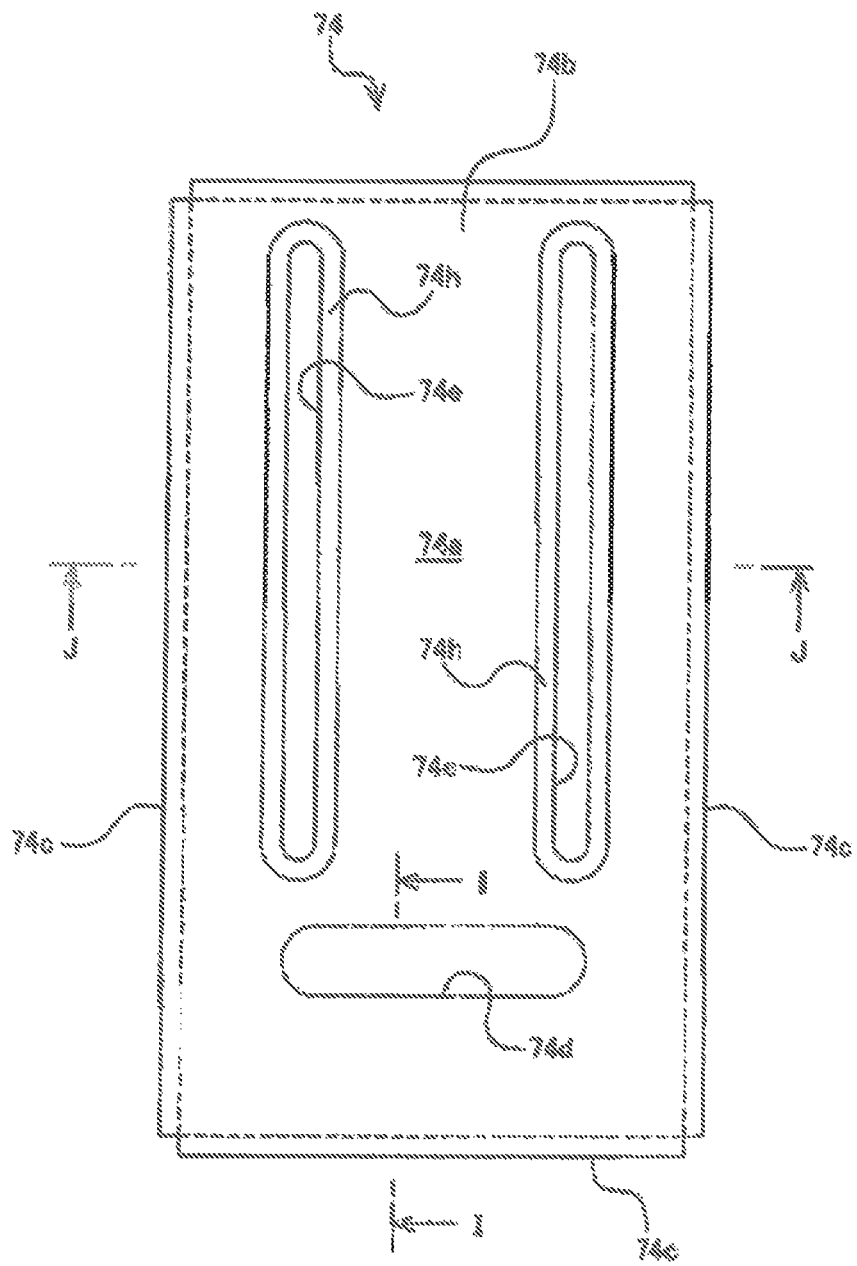
FIG. 27 is a top elevational view of a connection member 74 in a floor panel 70 according to a third embodiment of the present invention.
Figure 28:
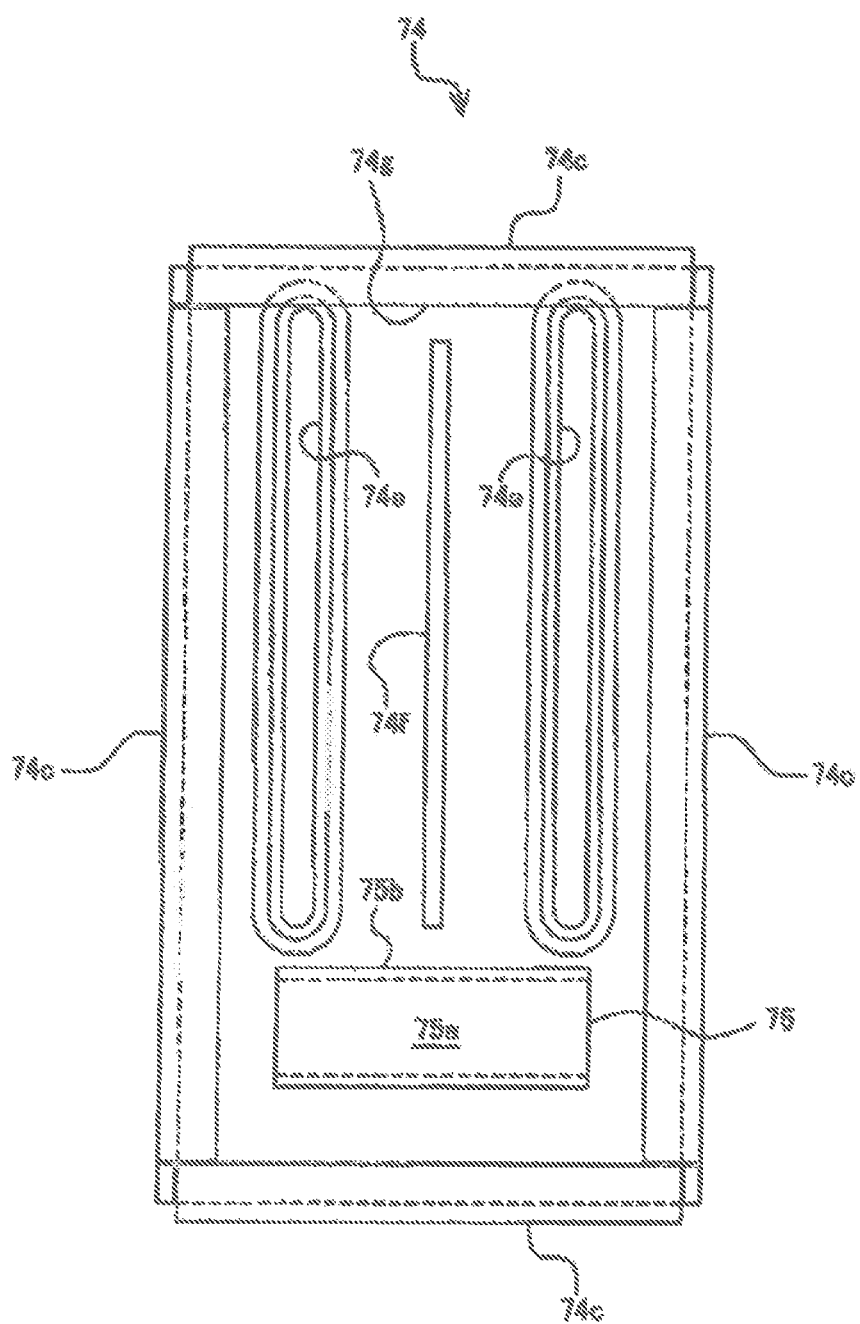
FIG. 28 is a bottom elevational view of the connection member 74 shown in FIG. 27.
Figure 29:
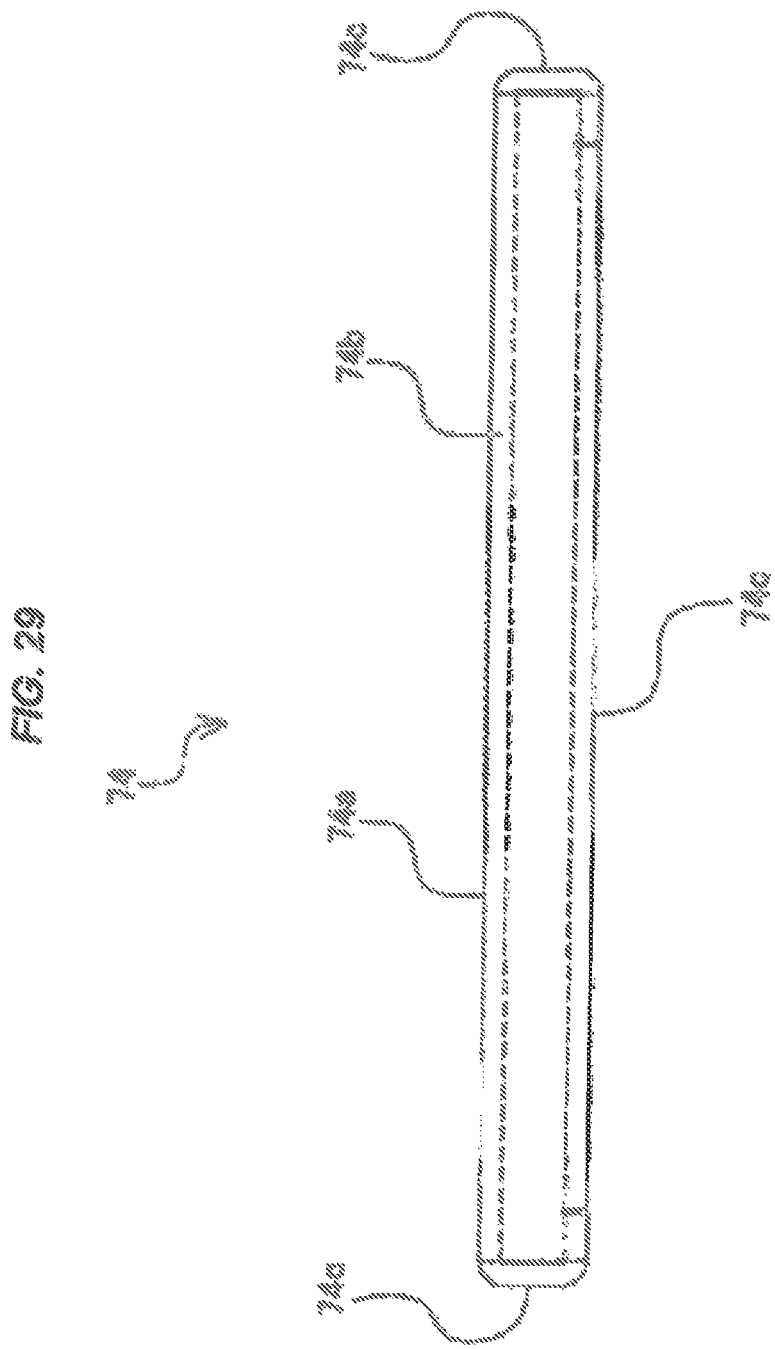
FIG. 29 is a right side elevational view of the connection member 74 shown in FIG. 27.

The connection member 74 of the floor panel 70 according to the present embodiment has a shape obtained by cutting the connection member 34 (refer to FIG. 9) of the floor panel 20 according to the first embodiment approximately into half, as shown in FIG. 27, More specifically, four through holes 34e having the long-hole shaped opening shape extending in the right-and-left direction in FIG. 9 are formed in the connection member 34 of the floor panel 20 according to the first embodiment. However, two through holes 74e having a long-hole shaped opening shape extending in an up-and-down direction in FIG. 27 are formed in the connection member 74 of the floor panel 70 according to the present embodiment.

Further, two through holes 34d having the long-hole shaped opening shape extending in the up-and-down direction in FIG. 9 are formed in the connection member 34 of the floor panel 20 according to the first embodiment, and the rail member 35 is bonded to the lower surface 34i of the top plate portion 34b so as to cover the opening portions of the through holes 34d from the lower side in FIG. 12.

Figure 30:
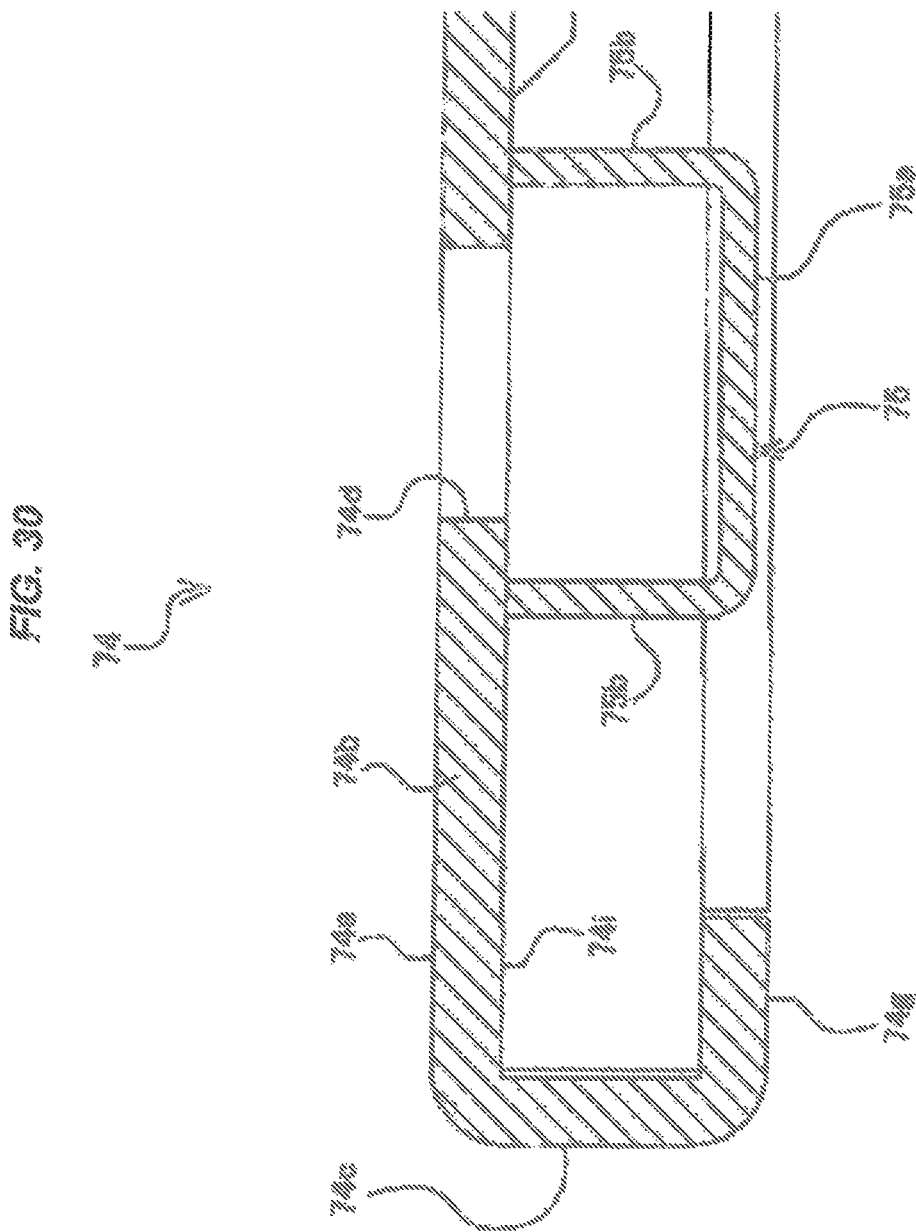
FIG. 30 is a cross sectional view of the connection member 74 shown in FIG. 27 as seen from an arrow along a line I-I.
Figure 31:
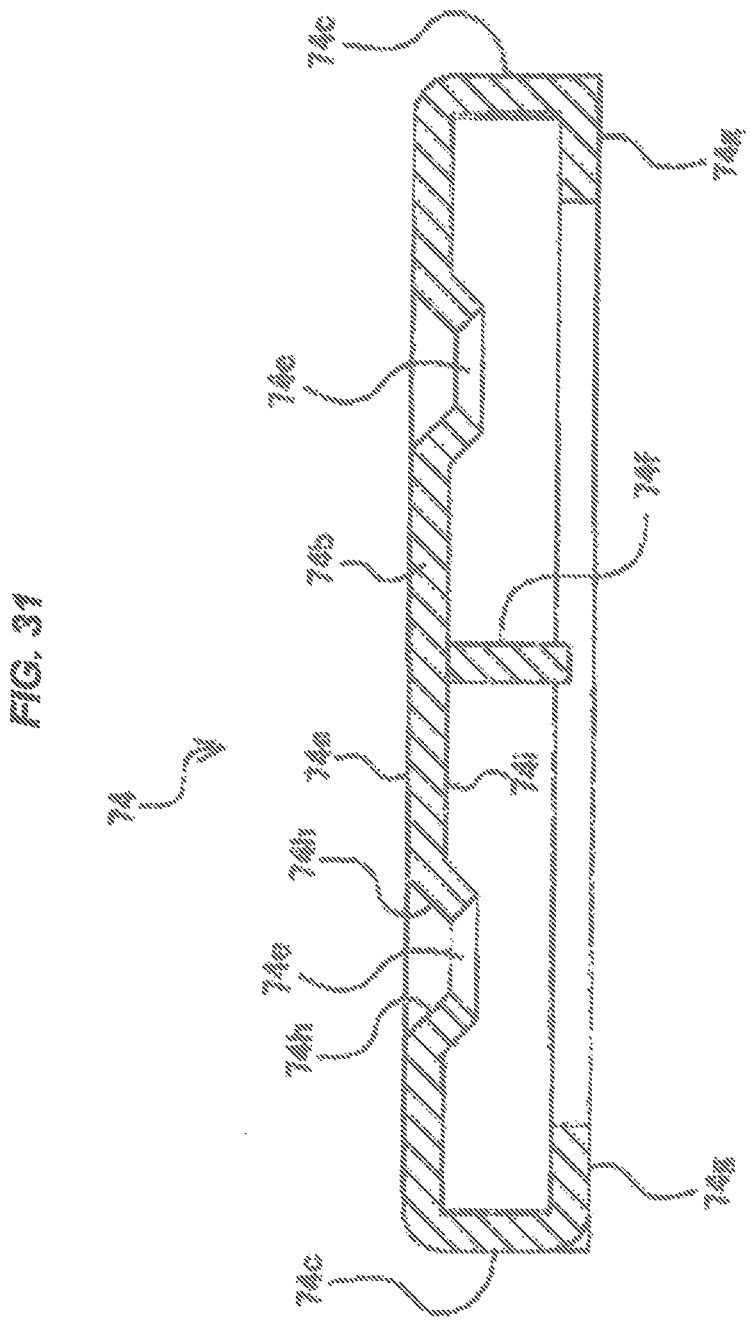
FIG. 31 is a cross sectional view of the connection member 74 shown in FIG. 27 as seen from an arrow along a line J-J.

In the meanwhile, one through hole 74d having a long-hole shaped opening shape extending in a right-and-left direction in FIG. 27 is formed in the connection member 74 of the floor panel 70 according to the present embodiment, and a rail member 75 is bonded to a lower surface 74i of a top plate portion 74b so as to cover an opening portion of the through hole 74d from a lower side in FIG. 30.

Further, in the same manner as the floor panel 20 according to the first embodiment, the nut member 41 (refer to FIG. 22) which is movable along the length direction of (the right-and-left direction in FIG. 28) of the rail member 75 is arranged within the rail member 75 of the connection member 74, and the leading end portion of the male thread portion 26b (refer to FIG. 22) of the fixing bolt 26 is structured such as to be inserted into the through hole 74b (refer to FIG. 30) of the connection member 74 and be threadably fastened to the female thread portion 41a of the nut member 41.

The other structures are the same as those of the floor panel 20 according to the first embodiment.

The same effects as those of the floor panel 20 according to the first embodiment can be also obtained by the floor panel 70 according to the present embodiment.

Figure 32:
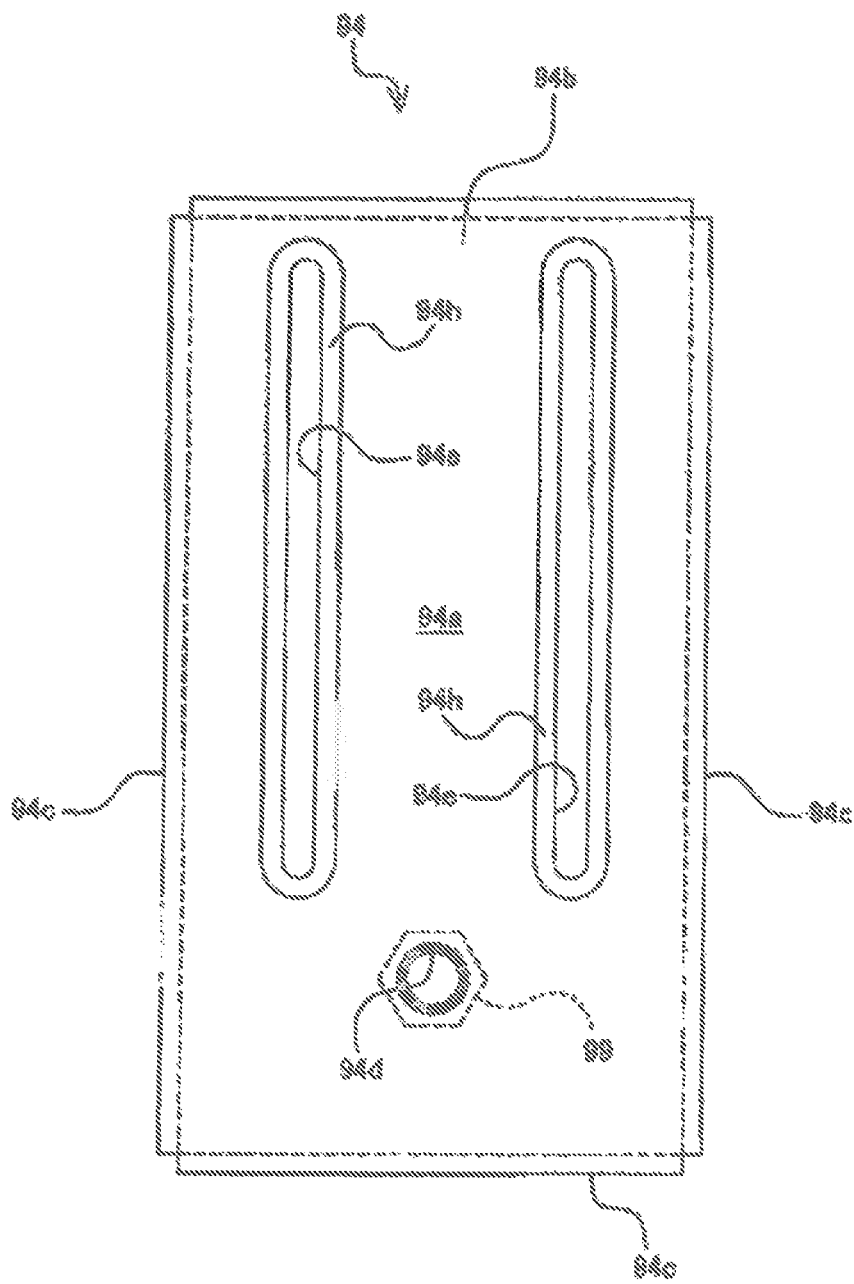
FIG. 32 is a top elevational view of a connection member 94 in a floor panel 90 according to a fourth embodiment of the present invention.
Figure 33:
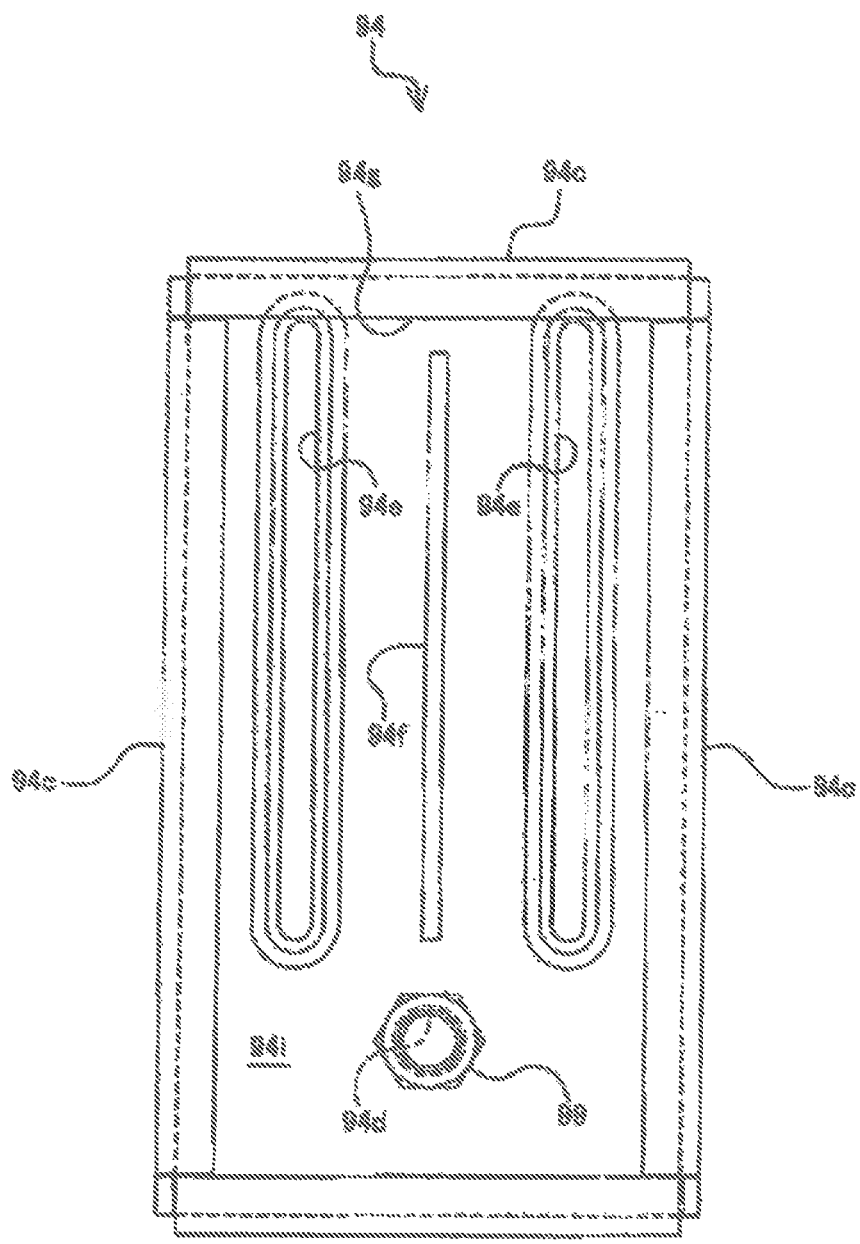
FIG. 33 is a bottom elevational view of the connection member 94 shown in FIG. 32.
Figure 34:
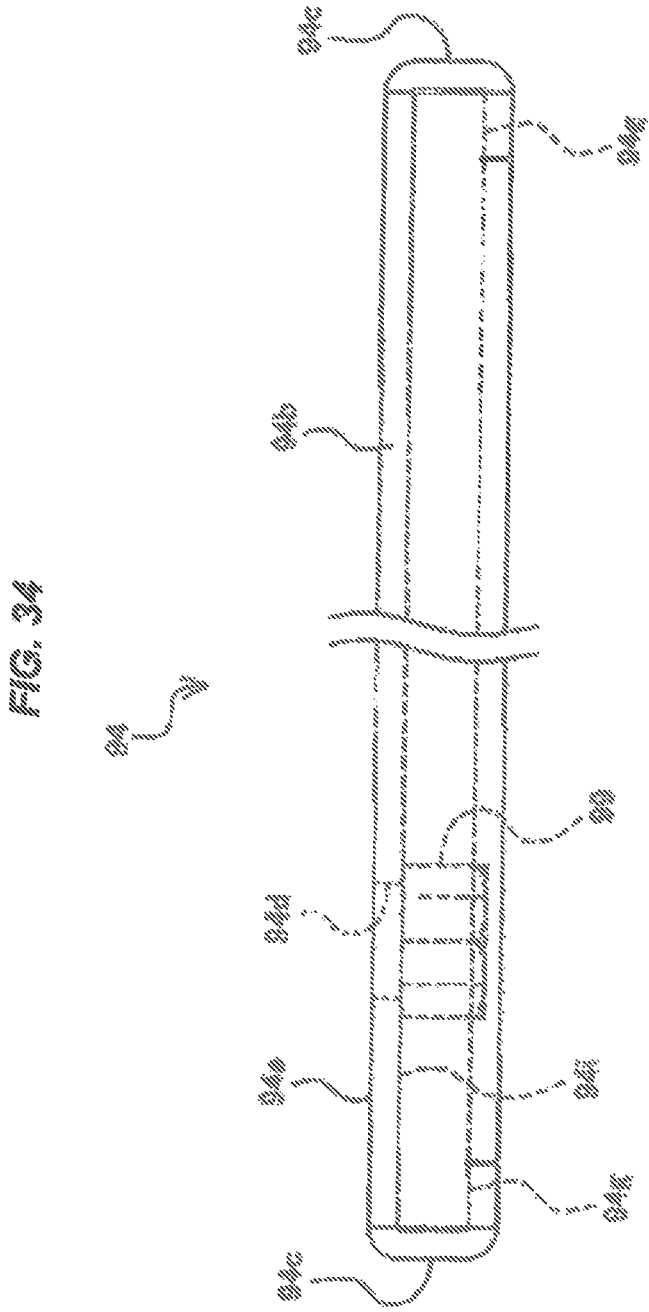
FIG. 34 is a right side elevational view showing a part of the connection member 94 shown in FIG. 32 in an abbreviating manner.

FIGS. 32 to 34 are views which are referred to for describing a floor panel 90 (a double floor member) according to a fourth embodiment of the present invention, The floor panel 90 according to the present embodiment is different from the floor panel 70 according to the third embodiment in a point that a connection member 94 (a second connection member) is provided in place of the connection member 74 in the floor panel 70 according to the third embodiment.

One through hole 74d having the long-hole shaped opening shape extending in the right-and-left direction in FIG. 27 is formed in the top plate portion 74b in the connection member 74 of the floor panel 70 according to the third embodiment. However, one round-hole shaped through hole 94d is formed in a connection member 94 of the floor panel 90 according to the present embodiment as shown in FIG. 32.

Further, in the connection member 74 of the floor panel 70 according to the third embodiment, the rail member 75 is bonded to the lower surface 74i of the top plate portion 74b so as to cover the opening portion of the through hole 74d from the lower side in the drawing as shown in FIG. 30. However, in the connection member 94 of the floor panel 90 according to the present embodiment, a nut 99 is bonded by welding at a position where a through hole 94d is formed in a lower surface 94i of a top plate portion 94b, as shown in FIG. 34.

Further, in the floor panel 20 according to the first embodiment, the leading end portion of the male thread portion 26b of the fixing bolt 26 is threadably fastened to the female thread portion 41a of the nut member 41 as shown in FIG. 22. In the same manner, the leading end portion of the male thread portion 26b of the fixing bolt 26 is structured such as to be inserted to the through hole 94d of the connection member 94 and be threadably fastened to the nut member 99 (refer to FIG. 34).

The other structures are the same as those of the floor panel 70 according to the third embodiment.

The same effects as those of the floor panel 20 according to the first embodiment can be also obtained by the floor panel 90 according to the present embodiment.

FIGS. 35 to 38 are views which are referred to for describing a floor panel 110 (a double floor member) according to a fifth embodiment of the present invention.

The floor panel 110 according to the present embodiment is different from the floor panel 20 according to the first embodiment in a point that a connection member 114 (a second connection member) is provided in place of the connection member 34 in the floor panel 20 according to the first embodiment.

The connection member 34 of the floor panel 20 according to the first embodiment is formed into the approximately box shape by having the top plate portion 34b which is formed into the plate shape, four side plate portions 34c which are formed by being folded approximately vertically downward from four sides of the top plate portion 34b, and the folded portions 34g which are folded approximately vertically toward the center side of the connection member 34 from the lower end portions of the side plate portions 34c, as shown in FIGS. 9 to 13.

Therefore, the upper surface 34a of the top plate portion 34b in the connection member 34 is formed flat over an approximately whole area, and any step is not formed between the area where the through hole 34e is formed, and the area where the through hole 38d is formed (refer to FIGS. 11 to 13).

Figure 35:
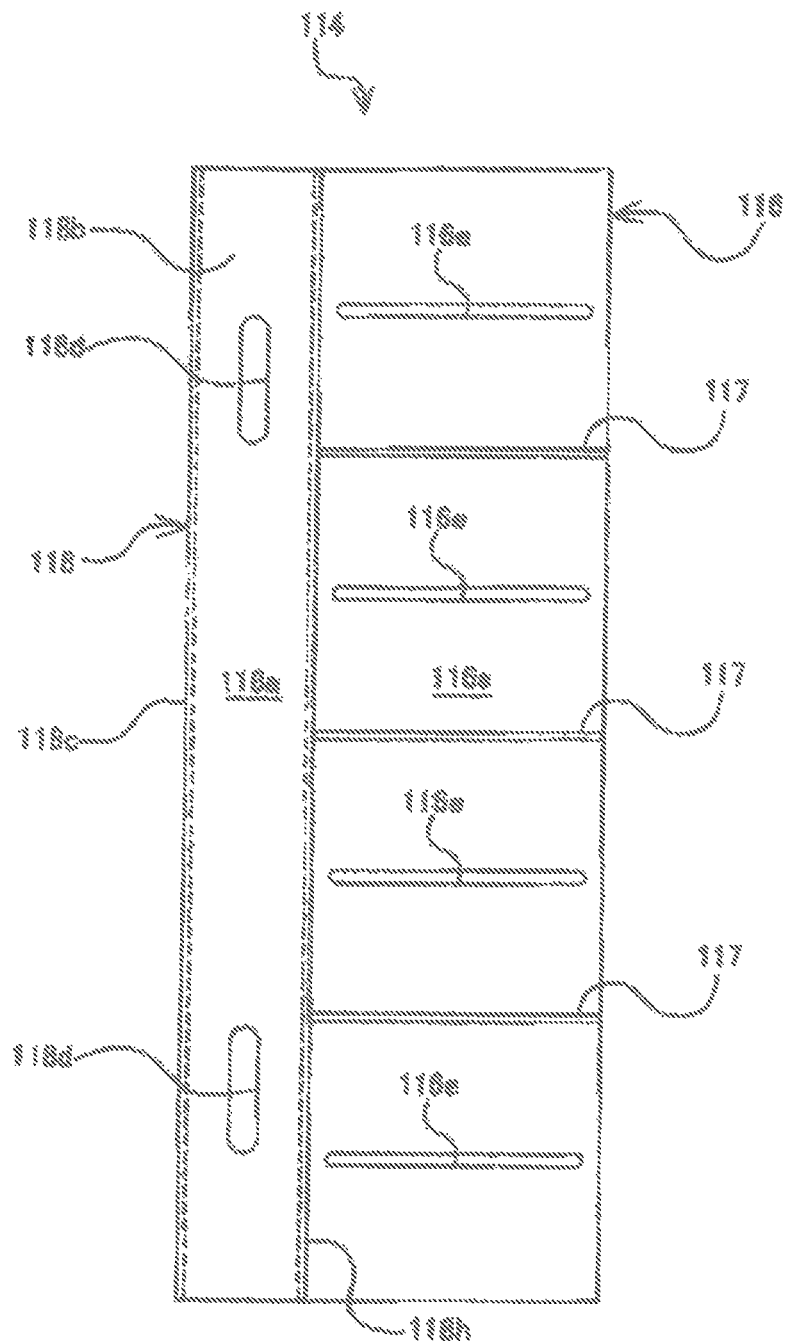
FIG. 35 is a top elevational view of a connection member 114 in a floor panel 110 according to a fifth embodiment of the present invention.
Figure 36:
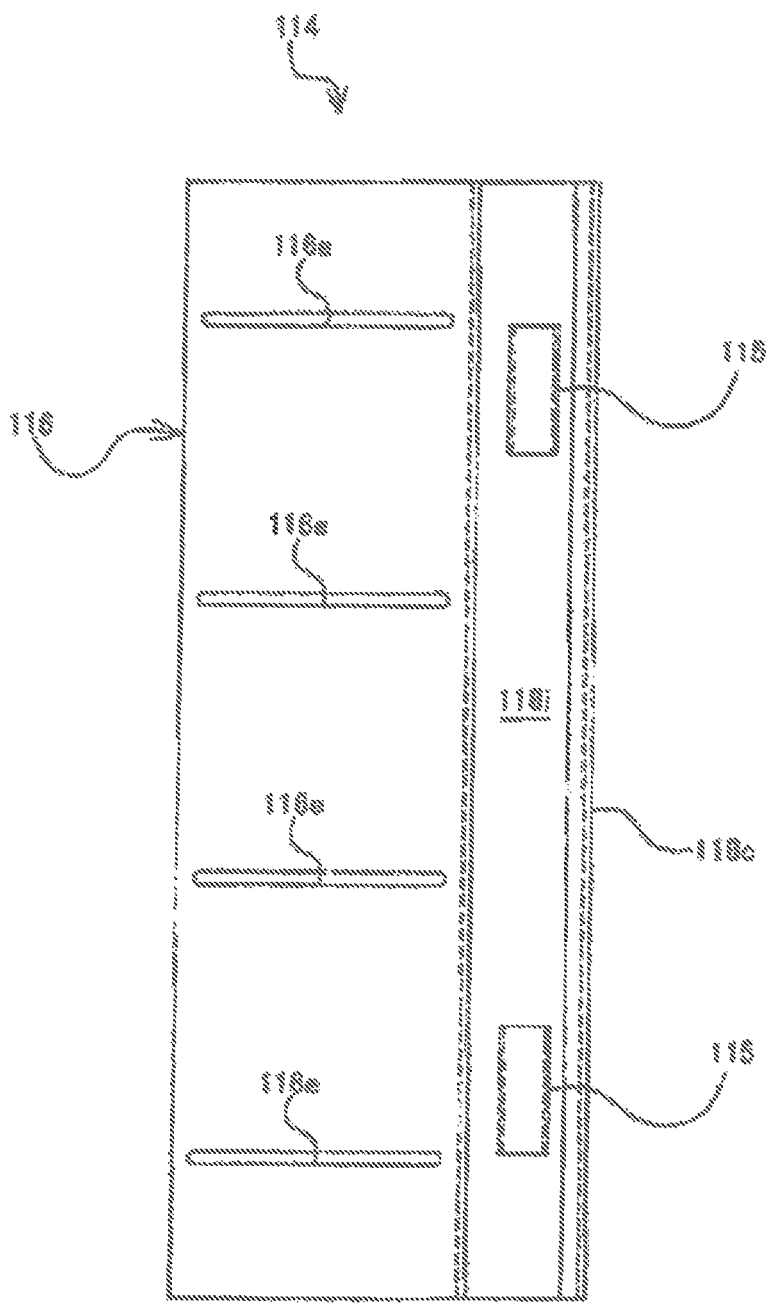
FIG. 36 is a bottom elevational view of the connection member 114 shown in FIG. 35.

In the meantime, the connection member 114 of the floor pane 110 according to the present embodiment is constructed by a flat plate portion 116 where a through hole 116e is formed, and a standing portion 118 where a through hole 118d is formed, as shown in FIG. 35, and a step (refer to FIG. 37) is formed between an upper surface 116a of the flat plate portion 116 and an upper surface 118a of a top plate portion 118b in the standing portion 118.

Figure 37:
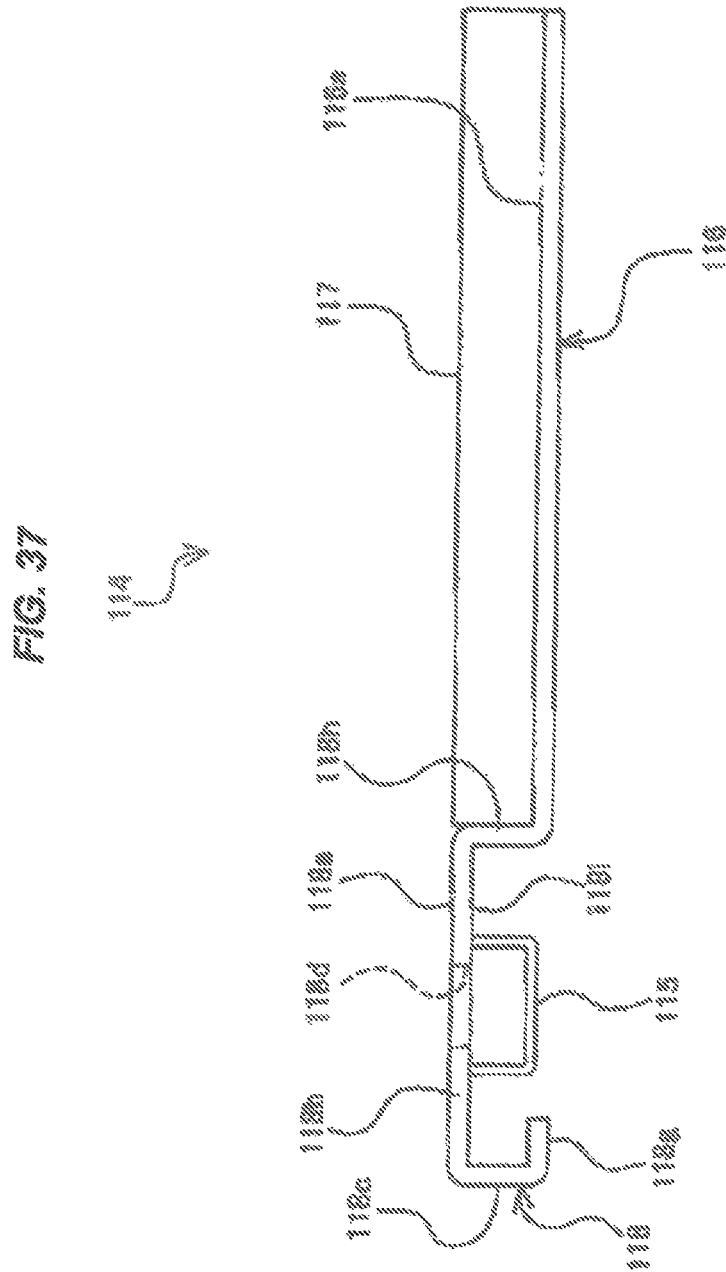
FIG. 37 is a front elevational view of the connection member 114 shown in FIG. 35.

The standing portion 118 is constructed by having a top plate portion 118b which is formed into a plate shape, a side plate portion 118c which is formed by being folded approximately vertically downward from a side portion in a left side of the drawing in the top plate portion 118b, a vertical plate portion 118h which is formed by being folded approximately vertically downward from a side portion in a right side of the drawing in the top plate portion 118b, and a folded portion 118g which is folded approximately vertically toward the center side of the connection member 114 from a lower end portion of the side plate portion 118c, as shown in FIG. 37.

Further, since the flat plate portion 116 is folded approximately vertically rightward from a lower end portion of the vertical plate portion 118h in the standing portion 118 and is formed so as to extend in a rightward direction in the drawing, as shown in FIG. 37, the flat plate portion 116 is arranged so that a step of a length of the vertical plate portion 118h in an up-and-down direction of the drawing is generated in relation to the top plate portion 118b of the standing portion 118.

Further, the inclined surface 34h inclined toward the lower side in the drawing from the upper surface 34a is formed in the top plate portion 34b of the floor panel 20 according to the first embodiment so as to be reduced its height toward the through hole 34e as shown in FIG. 13, so as to be along the through hole 34e which extends in the right-and-left direction in FIG. 10.

Figure 38:
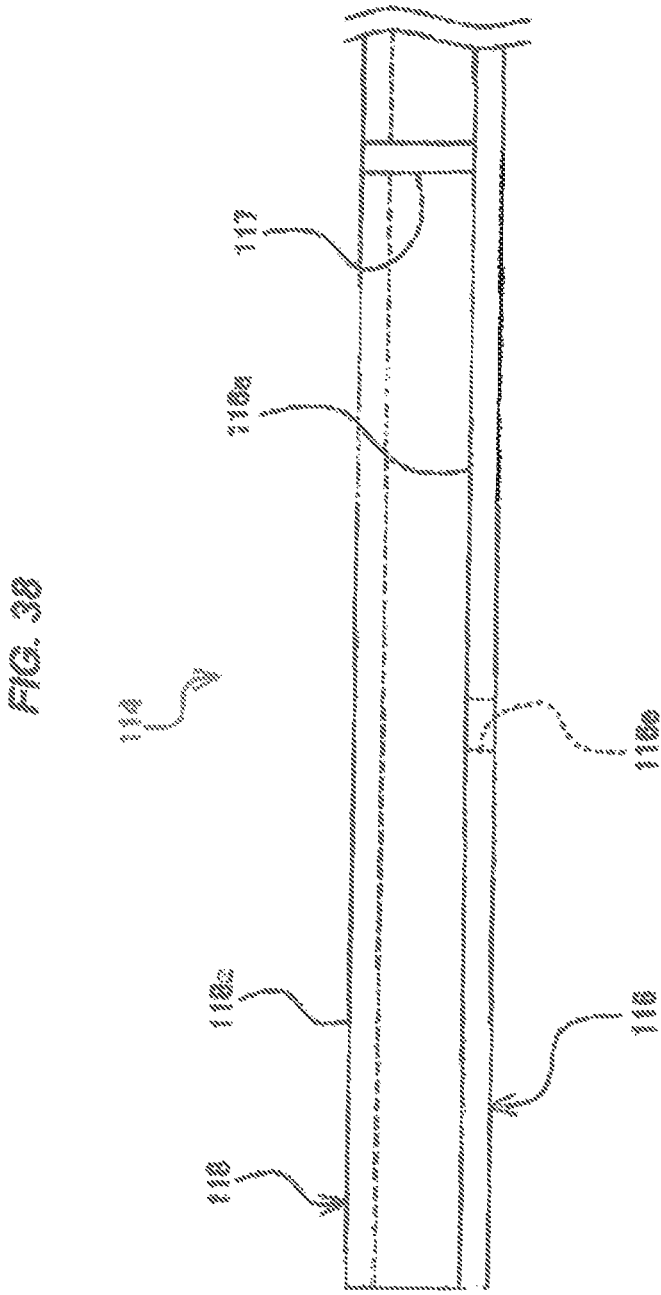
FIG. 38 is a right side elevational view showing a part of the connection member 114 shown in FIG. 35 in an abbreviating manner.

In the meantime, in the floor panel 110 according to the present embodiment, the inclined surface inclined toward the lower side in FIG. 38 from the upper surface 116a so as to be reduced its height toward the through hole 116e is not formed in the flat plate portion 116 as shown in FIG. 35.

Further, in the floor panel 20 according to the first embodiment, the plate-shaped rib 34f having the approximately rectangular shape in the cross sectional shape which is vertical to the length direction thereof (refer to FIG. 13) is bonded between two through holes 34e which are adjacent to each other, in the lower surface 34i of the top plate portion 34b so as to be approximately in parallel to the length direction of the through hole 34e, as shown in FIG. 10.

In the meantime, in the floor panel 110 according to the present embodiment, a plate-shaped rib 117 having an approximately rectangular shape in a cross sectional shape which is vertical to a length direction thereof (refer to FIG. 38) is bonded between two through holes 116e which are adjacent to each other in the upper surface 116a of the flat plate portion 116 so as to be in parallel to a length direction of the through hole 116e, as shown in FIG. 35.

Further, a rail member 115 is bonded by welding to a lower surface 118i of the top plate portion 118b so as to cover an opening portion of the through hole 118d formed in the top plate portion 118b of the standing portion 118 from a lower side in the drawing, as shown in FIG. 37.

Further, in the same manner as the floor panel 20 according to the first embodiment, the nut member 41 (refer to FIG. 22) which is movable along the length direction (the up-and-down direction in FIG. 36) of the rail member 115 is arranged within the rail member 115 of the connection member 114, and the leading end portion of the male thread portion 26b (refer to FIG. 22) of the fixing bolt 26 is structured such as to be inserted into the through hole 118d (refer to FIG. 37) of the connection member 114 and be threadably fastened to the female thread portion 41a of the nut member 41.

Further, in the floor panel 20 according to the first embodiment, the leading end portion of the male thread portion 39b of the flat head bolt 39 is inserted into the through hole 34e of the connection member 34 and is threadably fastened to the female thread hole 27a of the slide member 27, as shown in FIG. 8. In the same manner, the leading end portion of the male thread portion of the fixing bolt is structured such as to be inserted into the through hole 116e (refer to FIG. 38) of the connection member 114 and be threadably fastened to the female thread hole 27a of the slide member 27.

The other structures are the same as those of the floor panel 20 according to the first embodiment.

The same effects as those of the floor panel 20 according to the first embodiment can be also obtained by the floor panel 110 according to the present embodiment mentioned above.

FIGS. 39 to 42 are views which are referred to for describing a floor panel 130 (a double floor member) according to a size embodiment of the present invention.

The floor panel 130 according to the present embodiment is different from the floor panel 110 according to the fifth embodiment in a point that a connection member 134 (a second connection member) is provided in place of the connection member 114 in the floor panel 110 according to the fifth embodiment.

Figure 39:
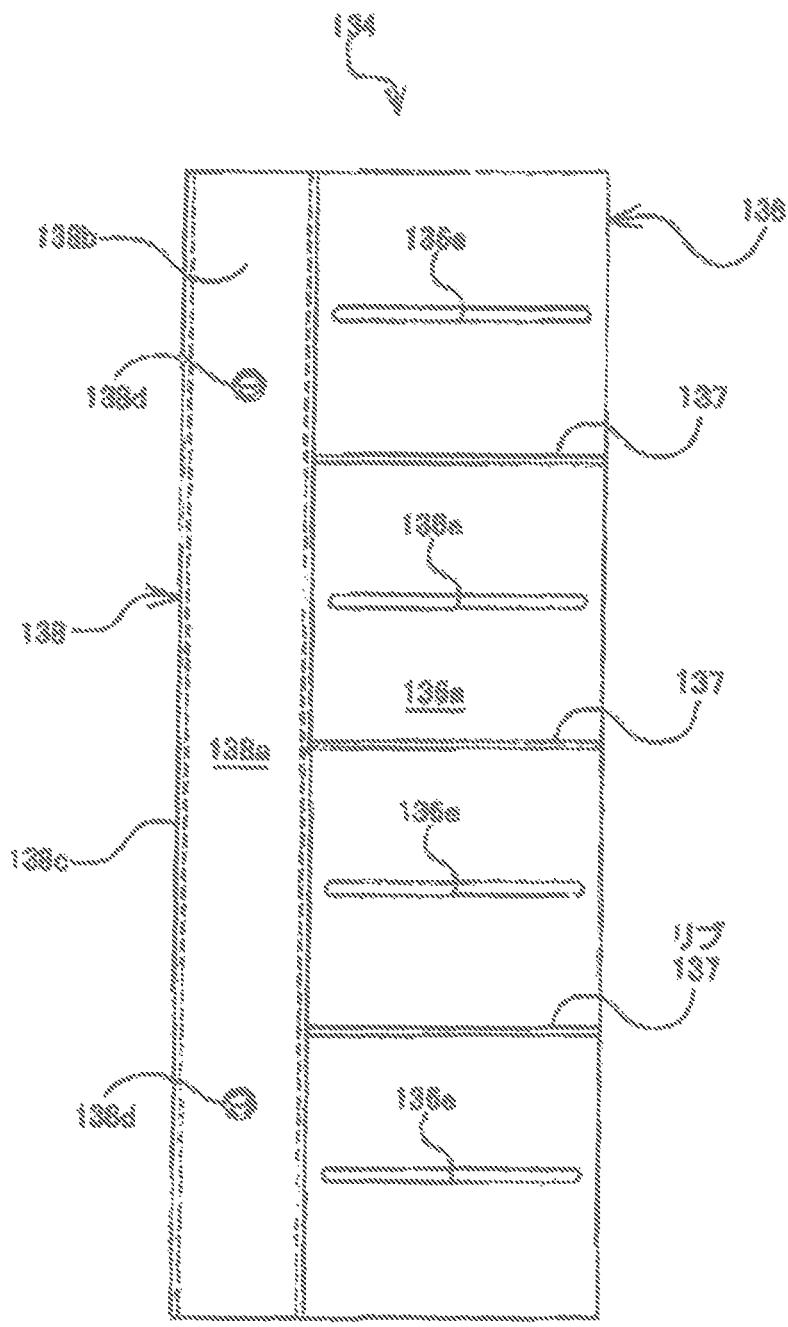
FIG. 39 is a top elevational view of a connection member 134 in a floor panel 130 according to a sixth embodiment of the present invention.

In the connection member 114 of the floor panel 110 according to the fifth embodiment, two through holes 118d having the long-hole shaped opening shape extending in the up-and-down direction of the drawing are formed in the top plate portion 118b of the standing portion 118, as shown in FIG. 35. However, in the connection member 134 of the floor panel 130 according to the present embodiment, two round-hole shaped through holes 138d are formed in a top plate portion 138b of a standing portion 138 as shown in FIG. 39.

Further, in the connection member 114 of the floor panel 110 according to the fifth embodiment, the rail member 115 is bonded to the lower surface 118*i* of the top plate portion 118*b* so as to cover the opening portion of the through hole 118*d* in the top plate portion 118*b* from the lower side in the drawing, as shown in FIG. 37.

Figure 40:
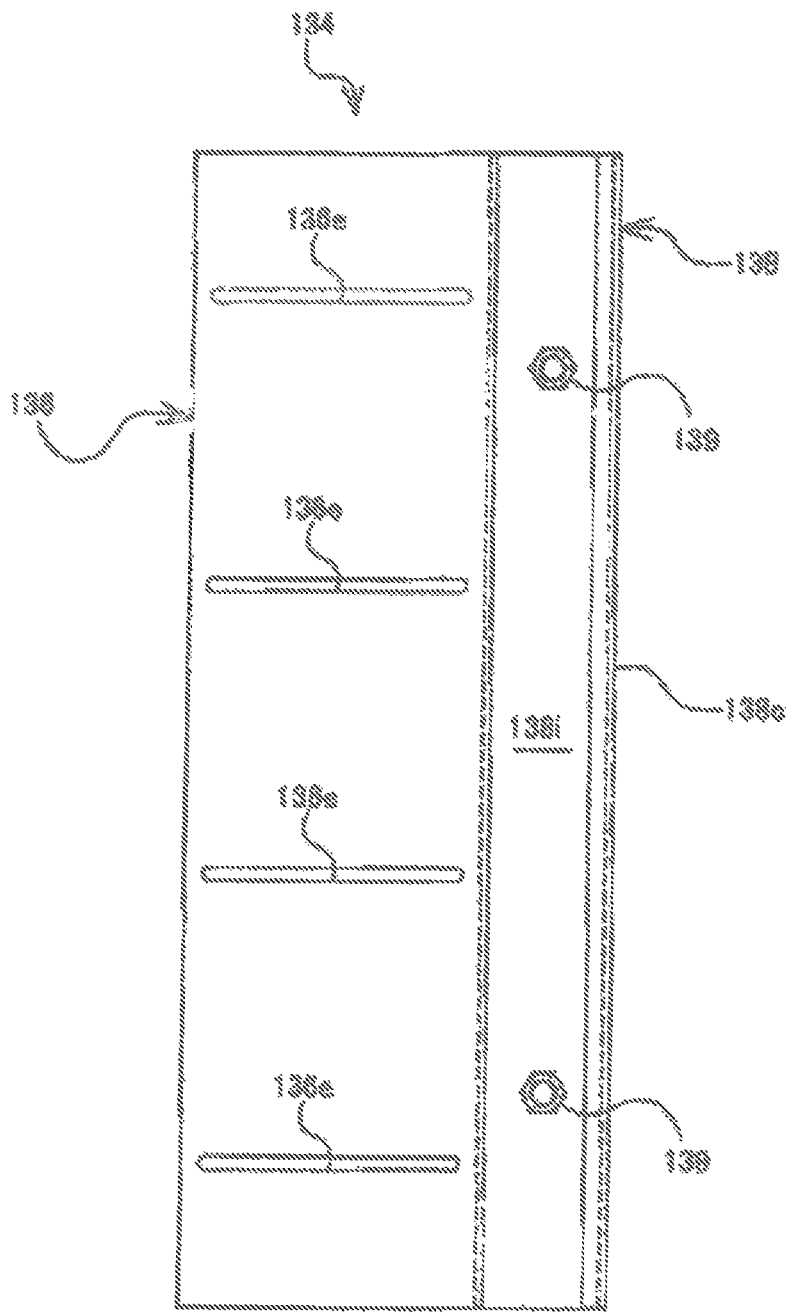
FIG. 40 is a bottom elevational view of the connection member 134 shown in FIG. 39.
Figure 41:
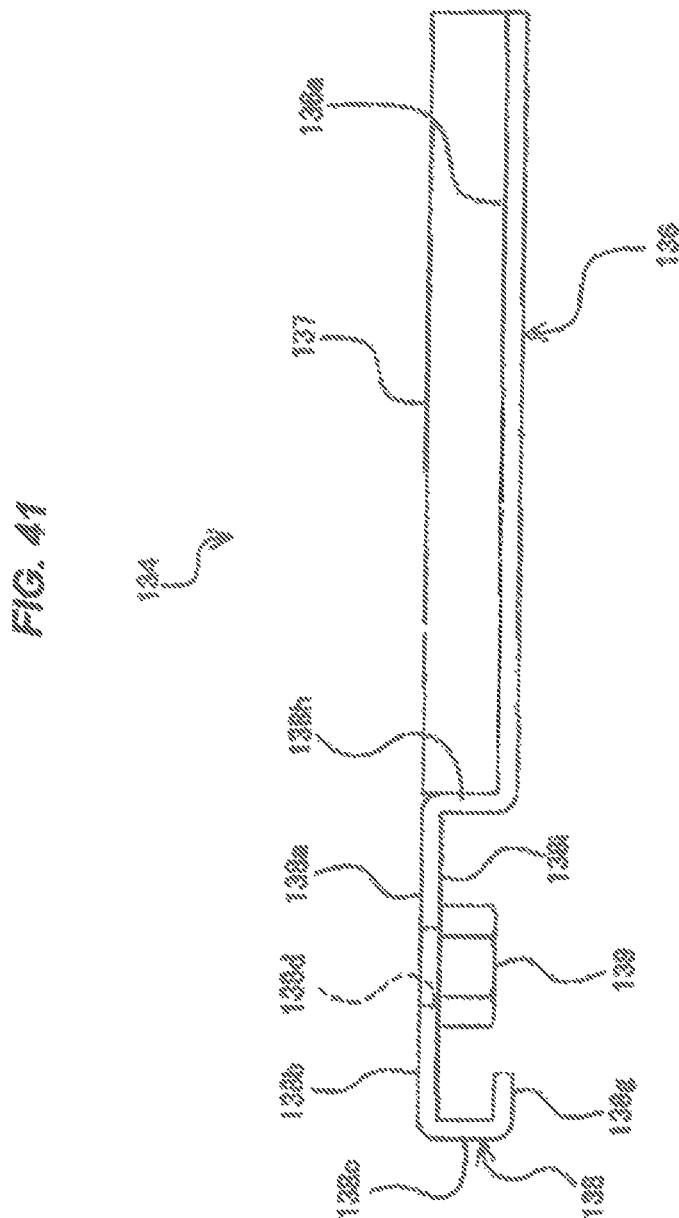
FIG. 41 is a front elevational view of the connection member 134 shown in FIG. 39.
Figure 42:
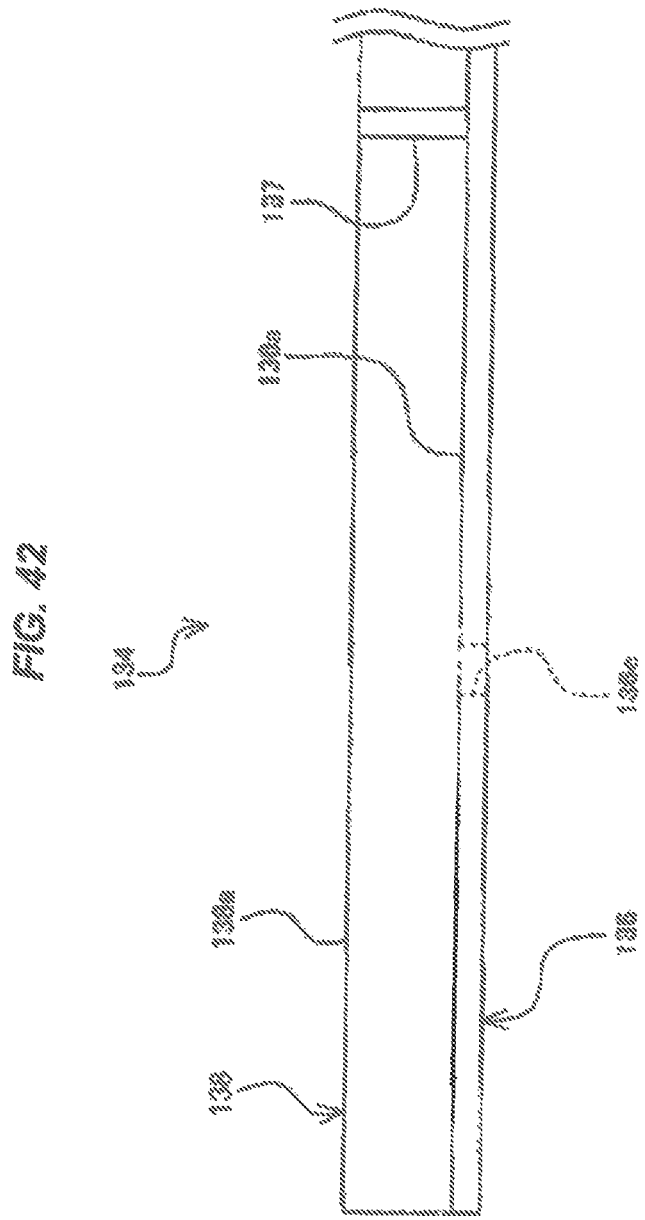
FIG. 42 is a right side elevational view showing a part of the connection member 134 shown in FIG. 39 in an abbreviating manner.
Figure 43:
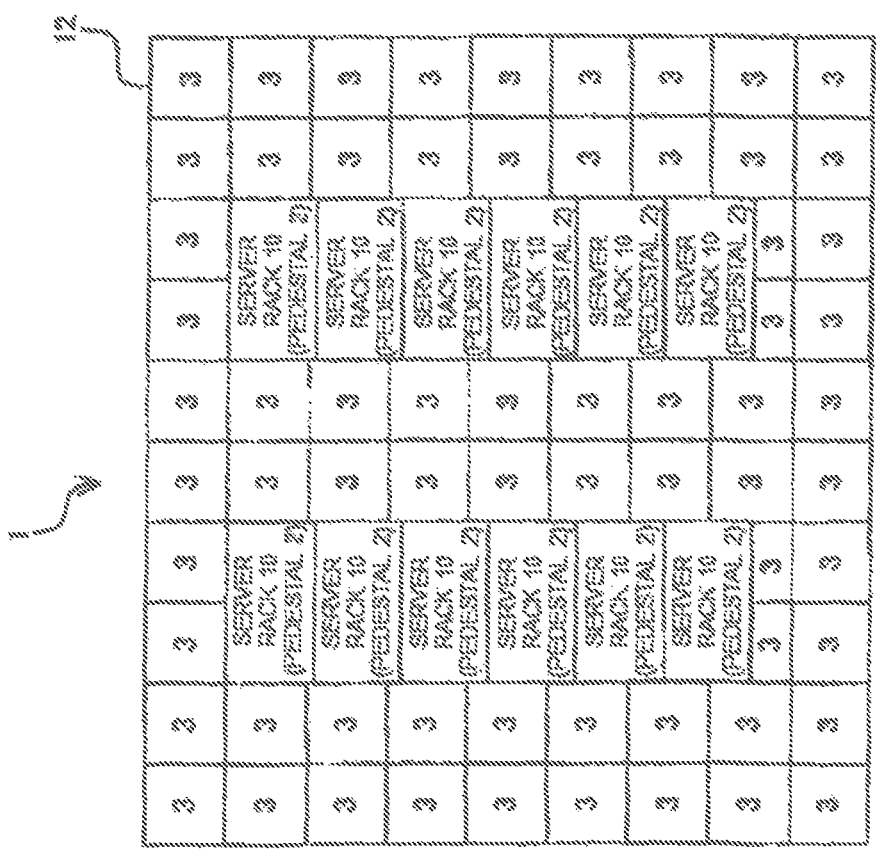
FIG. 43 is a schematically plan view of a data center 1 where a floor panel 3 according to the prior art is used.

In the meantime, in the connection member 134 of the floor panel 130 according to the present embodiment, a nut member 139 is bonded by welding at a position where the through hole 138*d* in the lower surface 138*i* of the top plate portion 138*b* is formed, as shown in FIGS. 40 and 41.

Further, in the floor panel 20 according to the first embodiment, the leading end portion of the male thread portion 26*b* in the fixing bolt 26 is threadably fastened to the female thread portion 41*a* of the nut member 41 as shown in FIG. 22. In the same manner, the leading end portion of the meal thread portion 26*b* in the fixing bolt 26 is structured such as to be inserted into the through hole 138*d* of the connection member 134 and be threadably fastened to the nut member 139 (refer to FIG. 41), The other structures are the same as those of the floor panel 110 according to the fifth embodiment.

The same effects as those of the floor panel 20 according to the first embodiment can be also obtained by the floor panel 130 according to the present embodiment.

The present invention is not limited only to the first to sixth embodiments, but the floor panel can be variously modified within a range which can achieve the object of the present invention.

For example, in the floor panel 20 according to the first embodiment, two guide rails 24 are fixed to the panel main body portion 21 of one floor panel 20 as shown in FIG. 2, however, the number of the guide rails is not limited to two, but one guide rail 24 may be fixed, or three or more guide rails 24 may be fixed.

Further, in the floor panels 20 according to the first to sixth embodiments, the server rack 200 is fixed to the floor panel 20 by threadably fastening the fixing bolt 26 and the nut member 41, however, the other fixing method using the other fixing members than the fixing bolt 26 can be employed without being restricted to the fixing (connecting) method as mentioned above.

Further, in the floor panel 20 according to the first embodiment, the guide rail 24 is formed into the straight line extending in one direction in its length direction, however, the guide rail 24 may be formed to have a curved portion in its length direction without being restricted to the shape as mentioned above.

Further, in the floor panel 20 according to the first embodiment, the guide rail 24 is arranged approximately in parallel to the side portion of the tile 22 in its length direction (refer to FIG. 2), however, may be arranged, for example, diagonally in relation to the side portion of the tile 22.

Further, in the floor panel 20 according to the first embodiment, the server rack 200 is fixed to the floor panel 20, however, the other casings or members may be fixed without being restricted to the server rack.

Further, in the floor panel 20 according to the first embodiment, the guide rail 24 is fixed to the panel main body portion 21 of the die casing product which employs the aluminum alloy for the material thereof, however, the other kinds of panel main body portions may be employed without being restricted to the panel main body portion 21.

Further, in the floor panel 20 according to the first embodiment, the guide rail 24 and the connection member 34 are fixed to the panel main body portion 21, however, may be fixed to the frame 2 (the double floor member) which is used in the data center 1 according to the prior art (refer to FIG. 44).

The same effects as those of the floor panel 20 according to the first embodiment can be obtained by using the frame 2 in place of the floor panel 20 according to the first embodiment.

Further, the tile 22 such as the vinyl chloride P-tile or the high pressure laminate (HPL) tile is attached to the upper surface side of the flat plate portion 21*a* in the panel main body portion 21, however, a soft type sheet such as a vinyl chloride sheet may be, for example, attached or a tile carpet may be attached, without being restricted to the hard type tile. Further, nothing may be attached to the upper surface side of the flat plate portion 21*a* in the panel main body portion 21.

Further, in the floor panel 20 according to the first embodiment, the through hole 34*e* of the connection member 34 connected to the guide rail 24 is formed into the long-hole shape (refer to FIG. 9) so as to extend vertically to the length direction of the guide rail 24, as shown in FIG. 2. However, the structure is not limited to the above structure.

Therefore, the through hole 34*e* of the connection member 34 may be formed into a long-hole shape so as to extend in a different direction from the length direction (the right-and-left direction in FIG. 2) of the guide rail 24 and the vertical direction (the up-and-down direction in FIG. 2) to the length direction of the guide rail 24.

Further, in the floor panel 20 according to the first embodiment, the through hole 34*e* of the connection member 34 connected to the guide rail 24 is formed into the long-hole shape so as to extend vertically to the length direction of the guide rail 24, as shown in FIG. 2. However, a plurality of round-hole shaped through holes may be formed so as to be spaced at predetermined distances in the vertical direction to the length direction of the guide rail 24.

Further, in the floor panel 20 according to the first embodiment, the guide rail 24 is arranged so as to extend in the right-and-left direction of the drawing over the approximately left end portion from the approximately right end portion of the drawing in the floor panel 20, as shown in FIG. 2. However, the guide rail 24 may be formed, for example, into a length which is approximately one third of the length of the guide rail 24 shown in FIG. 2 without being restricted to the length as mentioned above, and may be formed further shorted.

REFERENCE SIGNS LIST

1: data center
2: frame
2*a*: through hole
3: floor panel
4: angle member
5: base floor surface
6: upper plate member
7: supporting leg
8: fixing bolt
9: fixing nut
10: server rack
10*a*: bottom plate portion
11: anchor bolt
12: free access floor
20: floor panel
21: panel main body portion
21*a*: flat plate portion 21*b*: rib
21*c*: through hole
22: tile
22*a*: through hole
24: guide rail
24*a*: bottom plate portion
24*b*: through hole
25: plate member
25*a*: upper plate portion
25*b*: female thread hole
26: fixing bolt
26*a*: head portion
26*b*: male thread portion
27: slide member
27*a*: female thread hole
27*b*: lower plate portion
27*c*: protruding portion
27*d*: opening portion
29: flat head bolt
29*a*: head portion
29*b*: male thread portion
34: connection member
34*a*: upper surface
34*b*: top plate portion
34*c*: side plate portion
34*d*: through hole
34*e*: through hole
34*f*: rib
34*g*: folded portion
34*h*: inclined surface
34*i*: lower surface
35: rail member
35*a*: bottom plate portion
35*b*: side plate portion
39: flat head bolt
39*a*: head portion
39*b*: male thread portion
41: nut member
50: floor panel
54: connection member
54*a*: upper surface
54*b*: top plate portion
54*c*: side plate portion
54*d*: through hole
54*e*: through hole
54*f*: rib
54*g*: folded portion
54*h*: inclined surface
54*i*: lower surface
59: nut member
70: floor panel
74: connection member
74*a*: upper surface
74*b*: top plate portion
74*c*: side plate portion
74*d*: through hole
74*e*: through hole
74*f*: rib
74*g*: folded portion
74*h*: inclined surface
74*i*: lower surface
75: rail member
75*a*: bottom plate portion
75*b*: side plate portion
90: floor panel
94: connection member
94*a*: upper surface
94*b*: top plate portion
94*c*: side plate portion
94*d*: through hole
94*e*: through hole
94*f*: rib
94*g*: folded portion
94*h*: inclined surface
94*i*: lower surface
99: nut member
110: floor panel
114: connection member
115: rail member
116: flat plate portion
116*a*: upper surface
116*e*: through hole
117: rib
118: standing portion
118*a*: upper surface
118*c*: side plate portion
118*d*: through hole
118*g*: folded portion
118*h*: vertical plate portion
118*l*: lower surface
130: floor panel
134: connection member
136: flat plate portion
136*a*: upper surface
136*e*: through hole
137: rib
138: standing portion
138*a*: upper surface
138*c*: side plate portion
138*d*: through hole
138*g*: folded portion
138*h*: vertical plate portion
138*l*: lower surface
139: nut member
200: server rack
200*b*: bottom plate portion
200*c*: through hole

The invention claimed is:
1. A double floor member for supporting equipment, the double floor member comprising:
  a guide rail which is fixed to an upper surface side of the double floor member;
  a first connection member which is horizontally movable along a length direction of the guide rail and is engaged with the guide rail so as to prevent the first connection member from being pulled in a vertical direction away from the guide rail; and
  a second connection member configured to be fixed to said equipment and which is connected to the first connection member so as to prevent the second connection member from being lifted upwardly away from the first connection member,
  wherein the second connection member is horizontally movable with respect to the first connection member in a different direction from the length direction of the guide rail.
2. The double floor member according to claim 1, wherein the second connection member includes an elongated through hole extending approximately vertically to the length direction of the guide rail,
  wherein the second connection member is connected to the first connection member so as not to lift upward from the first connection member by being threadably fastened to the first connection member by a fixing bolt inserted into the through hole, and wherein the second connection member is horizontally movable along a length direction of the elongated through hole.

3. The double floor member according to claim 1, wherein a hole for connecting a casing of the equipment is formed in the second connection member so as to be connectable via a fixing bolt.

4. The double floor member according to claim 3, wherein the hole for connecting the casing is formed into elongated hole to enable adjustment of a position of the casing on the second connection member.

5. The double floor member according to claim 1, wherein the double floor member is a floor panel.

6. The double floor member according to claim 1, wherein the double floor member is a frame.

7. The double floor member according to claim 2, wherein a hole for connecting a casing of the equipment is formed in the second connection member so as to be connectable via a fixing bolt.

8. The double floor member according to claim 7, wherein the hole for connecting the casing of the equipment is formed into elongated hole to enable adjustment of a position of the casing on the second connection member.

9. The double floor member according to claim 2, wherein the double floor member is a floor panel.

10. The double floor member according to claim 3, wherein the double floor member is a floor panel.

11. The double floor member according to claim 4, wherein the double floor member is a floor panel.

12. The double floor member according to claim 7, wherein the double floor member is a floor panel.

13. The double floor member according to claim 8, wherein the double floor member is a floor panel.

14. The double floor member according to claim 2, wherein the double floor member is a frame.

15. The double floor member according to claim 3, wherein the double floor member is a frame.

16. The double floor member according to claim 4, wherein the double floor member is a frame.

17. The double floor member according to claim 7, wherein the double floor member is a frame.

18. The double floor member according to claim 8, wherein the double floor member is a frame.

19. The double floor member according to claim 1, wherein the equipment is a server rack.

* * * * *